(12) United States Patent
Kawasaki et al.

(10) Patent No.: US 7,679,131 B1
(45) Date of Patent: Mar. 16, 2010

(54) SEMICONDUCTOR DEVICE, MANUFACTURING METHOD THEREOF, AND ELECTRONIC DEVICE

(75) Inventors: Ritsuko Kawasaki, Kanagawa (JP); Kenji Kasahara, Kanagawa (JP); Shunpei Yamazaki, Tokyo (JP)

(73) Assignee: Semiconductor Energy Laboratory Co., Ltd., Atsugi-shi, Kanagawa-Ken (JP)

( * ) Notice: Subject to any disclaimer, the term of this patent is extended or adjusted under 35 U.S.C. 154(b) by 0 days.

(21) Appl. No.: 09/651,889

(22) Filed: Aug. 30, 2000

(30) Foreign Application Priority Data

Aug. 31, 1999  (JP) ................................ 11-244251

(51) Int. Cl.
*H01L 29/94* (2006.01)
(52) U.S. Cl. ................................ 257/327; 257/E21.09
(58) Field of Classification Search .................. 257/66, 257/75, 907, 904, 379, 903, 381, 383, 385, 257/393, 413, 67, 68, 288, 59, 72, 365, 57, 257/327, E21.09
See application file for complete search history.

(56) References Cited

U.S. PATENT DOCUMENTS

| | | | |
|---|---|---|---|
| 4,404,578 A * | 9/1983 | Takafuji et al. ................ 257/66 |
| 5,436,184 A * | 7/1995 | Muragishi .................... 438/151 |
| 5,508,533 A | 4/1996 | Takemura | |
| 5,594,569 A | 1/1997 | Konuma et al. | |
| 5,637,515 A | 6/1997 | Takemura | |
| 5,650,636 A | 7/1997 | Takemura et al. | |
| 5,858,823 A | 1/1999 | Yamazaki et al. | |

(Continued)

FOREIGN PATENT DOCUMENTS

JP   403050873 A  *  3/1991

(Continued)

OTHER PUBLICATIONS

Furue et al., "Characteristics and Driving Scheme of Polymer-Stabilized Monostable FLCD Exhibiting Fast Respons Time and High Contrast Ratio with Gray-Scale Capability", SID 98 Digest, pp. 782-785.

(Continued)

*Primary Examiner*—Bradley K Smith
*Assistant Examiner*—Amar Movva
(74) *Attorney, Agent, or Firm*—Nixon Peabody, LLP; Jeffrey L. Costellia

(57) ABSTRACT

A laser annealing method for obtaining a crystalline semiconductor film having a large grain size, and a method of manufacturing a semiconductor device using the crystalline semiconductor film, are provided. Using a shape change (convex portion or concave portion) of an amorphous semiconductor film when crystallizing the amorphous semiconductor film using irradiation of laser light, it is possible to intentionally regulate the origin of crystal growth, and to make the grain size large. By then designing the arrangement of an active layer (island shape semiconductor film) so as to contain at least a channel forming region within one grain, it becomes possible to improve the electrical characteristics of a TFT.

30 Claims, 21 Drawing Sheets

U.S. PATENT DOCUMENTS

| | | | | |
|---|---|---|---|---|
| 5,877,512 | A | * | 3/1999 | Kim .............................. 257/57 |
| 6,188,085 | B1 | * | 2/2001 | Shimizu et al. ............... 257/66 |
| 6,294,796 | B1 | * | 9/2001 | Mano et al. ................... 257/59 |
| 6,303,966 | B1 | * | 10/2001 | Park ............................. 257/393 |

FOREIGN PATENT DOCUMENTS

| | | | | |
|---|---|---|---|---|
| JP | 404152676 | A | * | 5/1992 |
| JP | 10-64842 | | | 3/1998 |
| JP | 2001028338 | A | * | 5/2000 |

OTHER PUBLICATIONS

Yoshida et al., "A Full-Color Thresholdless Antiferroelectric LCD Exhibiting Wide Viewing Angle with Fast Response Time", SID 97 Digest, pp. 841-844.

Inue et al., "Thresholdless Antiferroelectricity in liquid crystals and its application to displays", J. Mater. Chem., 1996, 6(4), pp. 671-673.

* cited by examiner

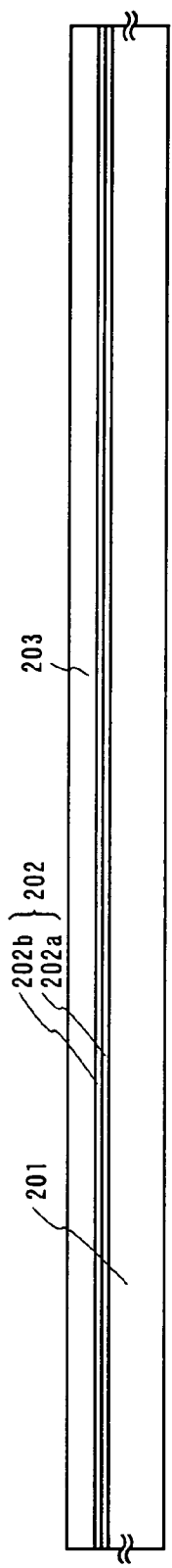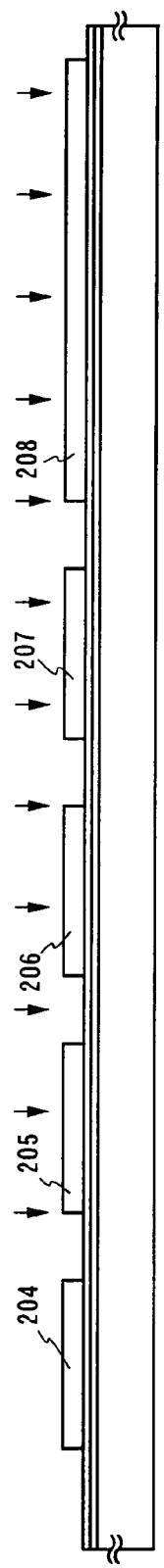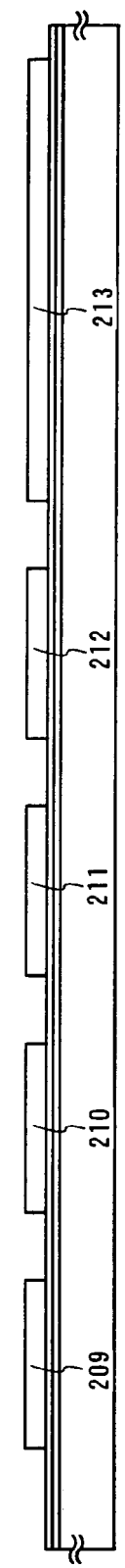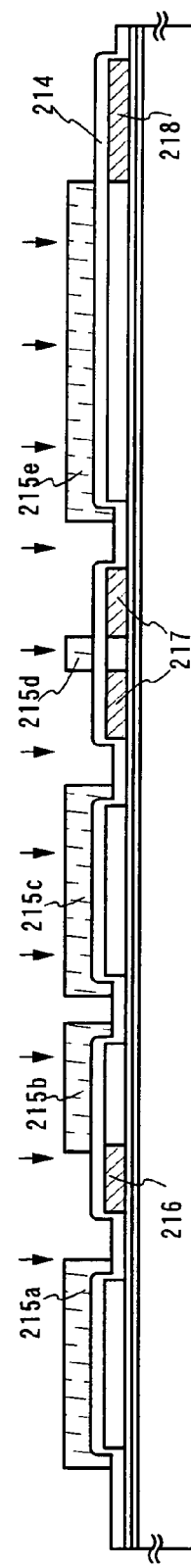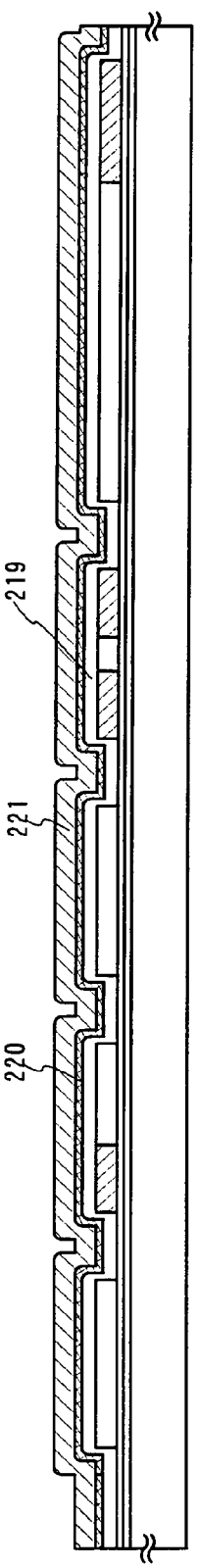

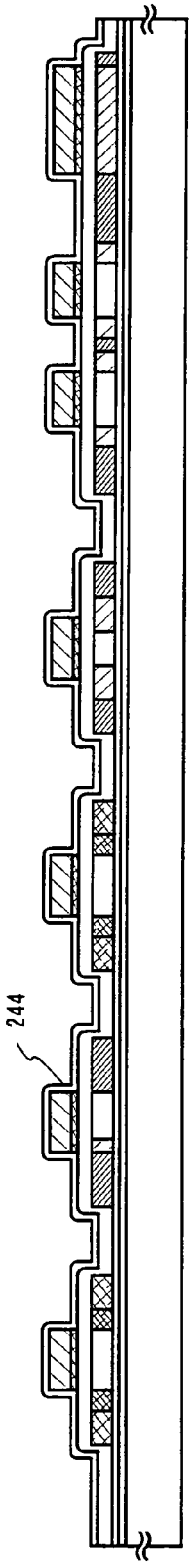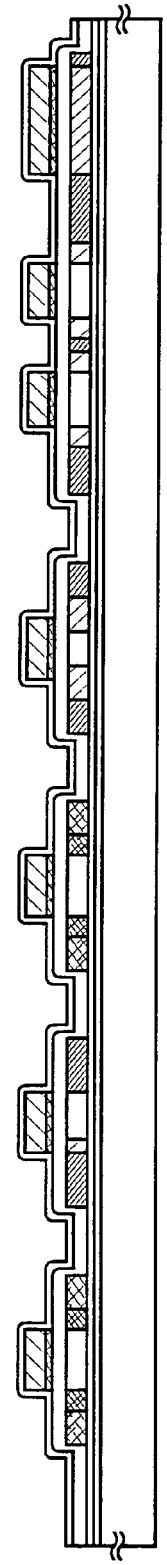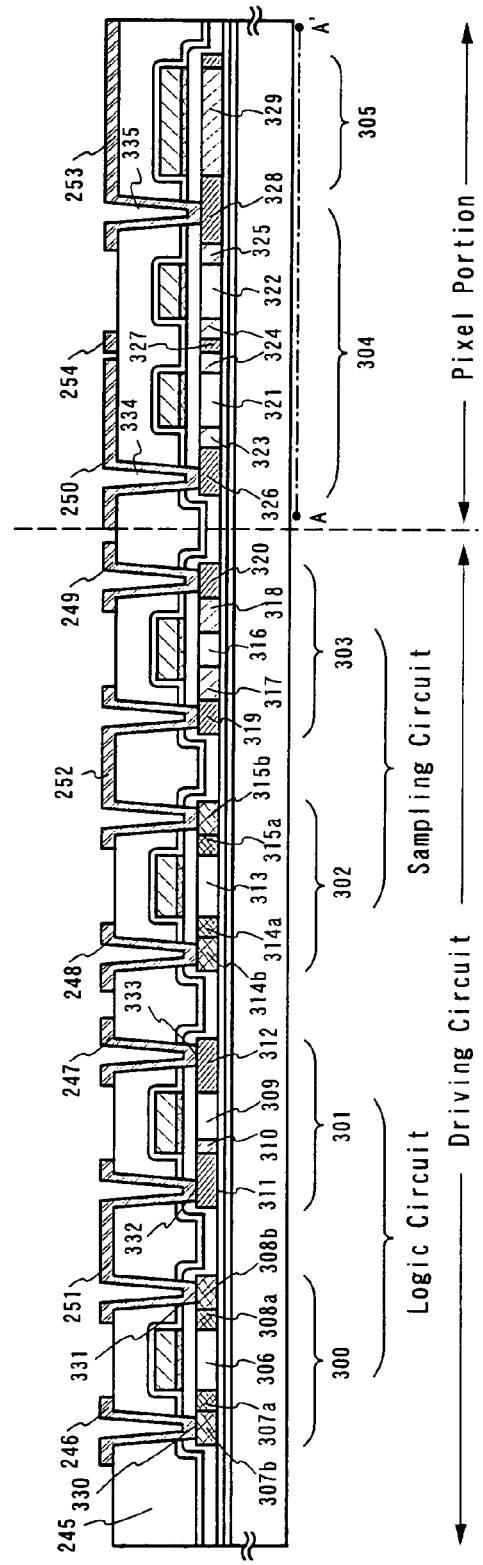

(Side View)

(Top View)

SEMICONDUCTOR DEVICE, MANUFACTURING METHOD THEREOF, AND ELECTRONIC DEVICE

BACKGROUND OF THE INVENTION

1. Field of the Invention

The present invention relates to a semiconductor device formed by a thin film transistor (hereafter referred to as TFT) using a semiconductor film as an active layer, and to a manufacturing method thereof. Specifically, the present invention relates to laser crystallization of a semiconductor film by laser annealing.

2. Description of the Related Art

An advance has been made in recent years in development of thin film transistors (hereinafter referred to as TFTs) using semiconductor films as active layers, and TFTs using polycrystalline silicon films (polysilicon films) as crystalline semiconductor films are receiving the attention. In liquid crystal display devices (liquid crystal displays) and EL (electroluminescence) display devices (EL displays), in particular, such TFTs are used as elements for switching pixels and elements for forming driver circuits to control the pixels.

General means for obtaining a polysilicon film is a technique in which an amorphous silicon film is crystallized into a polysilicon film. A method in which an amorphous silicon film is crystallized with the use of laser light has lately become the one that is especially notable. In this specification, to crystallize an amorphous semiconductor film with laser light to obtain a crystalline semiconductor film is called laser crystallization.

The laser crystallization is capable of instantaneous heating of semiconductor film, and hence is an effective technique as measures for annealing a semiconductor film formed on a low heat resistant substrate such as a glass substrate or a plastic substrate. In addition, the laser annealing makes the throughput definitely higher as compared with conventional heating measures using an electric furnace (hereinafter referred to as furnace annealing).

There are various kinds of laser light, of which the general one to be used in laser crystallization is laser light generated and emitted from a pulse oscillation type excimer laser as a source (hereinafter referred to as excimer laser light). The excimer laser has advantages in that it is large in output and that it is capable of repetitive irradiation at a high frequency and, moreover, excimer laser light is advantageous in terms of its high absorption coefficient with respect to silicon films.

The problem drawing the most attention at present is whether or not the grain size of a crystalline semiconductor film crystallized by laser light can be made larger. Naturally, if one grain becomes larger, in particular the number of grain boundaries crossing a channel forming region of a TFT is reduced. It is therefore possible to improve the dispersion in the electric field effect mobility and the threshold voltage, typical electrical characteristics of the TFT.

Further, relatively clean crystallinity within each grain is maintained, and in order to raise the above stated TFT characteristics, it is preferable to form the TFTs so as to have the channel forming region completely contained with one grain.

However, it is difficult to obtain a crystalline semiconductor film having a sufficiently large grain size with current techniques, and although there are reports of such films being obtained experimentally, at present this has not reached a level of practical use.

SUMMARY OF THE INVENTION

The present invention is a technique for solving the above problems, and an object of the present invention is to provide a laser annealing method for obtaining a crystalline semiconductor film having a large grain size, and to provide a method of manufacturing a semiconductor device using such a laser annealing method.

The point of the present invention is to make the grain size of a crystalline semiconductor film larger than the grain size of a conventional crystalline semiconductor film by using shape changes in an amorphous semiconductor film when performing laser crystallization of the amorphous semiconductor film. By making the grain size larger, a TFT is then formed by ideally fitting a channel forming region within a grain.

There are cases of shape changes in the amorphous semiconductor film indicating a convex portion (projecting portion), a concave portion, or a pore portion formed in the amorphous semiconductor film, and there are cases of shape changes in the amorphous semiconductor film indicating a region of the amorphous semiconductor film which changes shape continuously or in stages. The concave portion and the convex portion may of course have a rectangular shape, a semicircular shape, an elliptical shape, or a triangular shape.

Further, when implementing the present invention, it is preferable to perform crystallization after patterning the amorphous semiconductor film into a semiconductor film processed into an island shape (hereafter referred to as island shape semiconductor film). The amorphous semiconductor film in the state prior to patterning (a state directly after film deposition) must have a convex portion, a concave portion, or a pore portion formed by patterning. On that point it is possible to form the convex portion, the concave portion, or the pore portion at the same time as forming the island shape semiconductor film which later become the active layers, provided that this is performed after patterning into the island shapes.

Furthermore, an excimer laser (typically a KrF laser or an XeCl laser), a solid state laser (typically an Nd:YAG laser or a ruby laser), a gas laser (typically an argon laser or a helium neon laser), a metallic vapor laser (typically a copper vapor laser or a helium cadmium laser), or a semiconductor laser can be used as a laser which becomes a laser light emission sources used in crystallization of the amorphous semiconductor film.

In addition, the laser light emitting from these lasers may be emitted using either a pulse emission means or a continuous emission means.

Note that for cases of using laser light having a long wavelength for its fundamental wavelength, such as the Nd:YAG laser (first harmonic: 1064 nm wavelength), it is preferable to use the second harmonic (532 nm wavelength), the third harmonic (355 nm wavelength) or the fourth harmonic (266 nm wavelength). Non-linear shape crystals (non-linear shape elements) can be obtained using these harmonics. Further, a known Q-switch method may also be used.

BRIEF DESCRIPTION OF THE DRAWINGS

In the accompanying of the drawings:

FIGS. 2A to 2E are diagrams showing a process of manufacturing an active matrix type liquid crystal display device;

FIGS. 4A to 4C are diagrams showing a process of manufacturing an active matrix type liquid crystal display device;

DETAILED DESCRIPTION OF THE PREFERRED EMBODIMENTS

Embodiment Mode

Figure 1A:
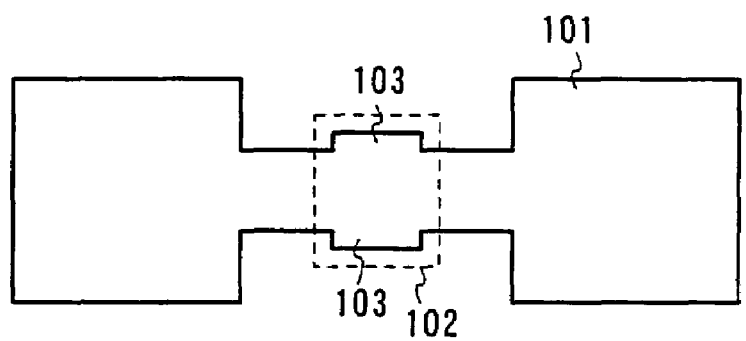
FIGS. 1A to 1C are diagrams showing states of the laser crystallization.
Figure 1B:
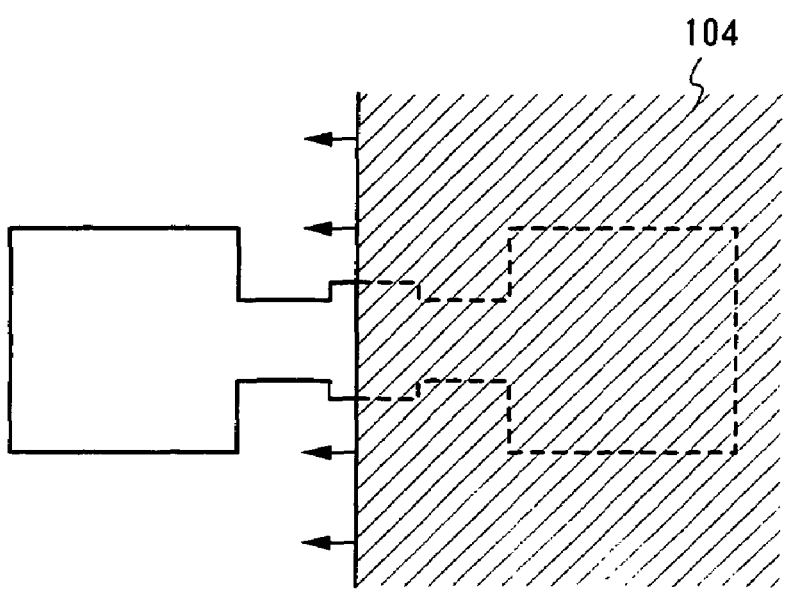
Figure 1C:
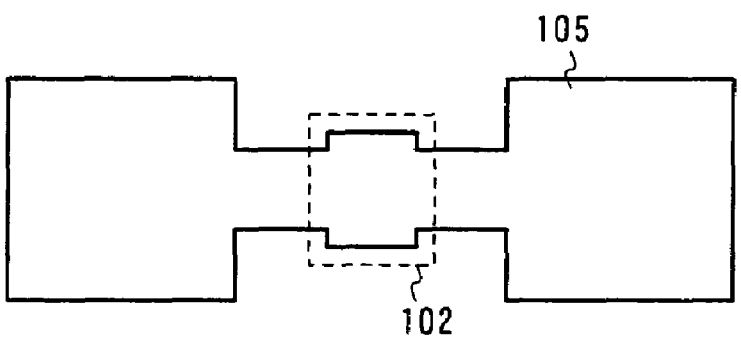

An embodiment mode of the present invention is explained using FIGS. 1A to 1C. In FIG. 1A, reference numeral 101 denotes an island shape semiconductor film obtained by patterning an amorphous semiconductor film. A region 102 containing a "channel forming region after TFT completion" is formed in the island shape semiconductor film 101. The region 102 is formed having a shape so as to form a convex portion 103 in the island shape semiconductor film 101. In other words, the convex portion (may also be a concave portion) is formed in the channel forming region, or in the vicinity of the channel forming region, in an active layer of the completed TFT. The term vicinity indicates a range within 1 µm from the edge of the channel forming region.

FIG. 1B is a state of irradiating the state of FIG. 1A with excimer laser light 104. The excimer laser light 104 is processed by an optical system so as to have a linear shape (strictly, a long and thin rectangular shape) in the cross sectional shape of the irradiation surface. Of course, the cross sectional shape may also be rectangular, but the throughput is increased by using the linear shape. The linear shape excimer laser light 104 is scanned in the direction shown by the arrows in FIG. 1B, performing crystallization of the island shape semiconductor film 101.

At this point, the above-described convex portion 103 becomes an origin (becomes a crystal nucleus) of crystal growth during laser crystallization and contributes to the enlargement of the grains. It is theoretically unclear at present by what mechanism crystallization proceeds, but it is thought that, by providing a crystal nucleus, this results in controlling the development of irregular nuclei which become a cause of crystal growth inhibition.

In FIG. 1C, reference numeral 105 denotes an island shape semiconductor region made from a crystalline semiconductor film formed by laser crystallization. The region enclosed by reference numeral 102 provides the location of the crystal nucleus in accordance with the convex portion 103 at this time, and therefore it is a region having large grain size when compared to other regions (regions other than the region 102 of the island shape semiconductor film 105).

In other words, by intentionally forming the convex portion 103, the location of the crystal nucleus can be arbitrarily provided, and therefore it becomes possible to form grains having a large grain size in a desired position. Using this phenomenon, it becomes possible to make sufficiently large the grain size of the region which becomes the channel forming region after the TFT is formed, and the number of grains contained in the channel forming region can be controlled.

Ideally, it is possible for the number of grain boundaries within the channel forming region to be zero by designing so that one channel forming region is formed within one grain. The crystallinity of the inside of each grain is high, so that each grain can be seen as essentially a single crystal, and therefore it is possible to improve the electrical characteristics of the TFT. Specifically, the subthreshold coefficient (S value) can be made smaller than conventional values, and it is possible to make the electric field effect mobility (mobility) larger than conventional values.

Embodiment 1

In Embodiment 1, a method of manufacturing a pixel TFT and a storage capacitance of a pixel portion and at the same time, a n-channel TFT and a p-channel TFT of a driver circuit that will be provided in the periphery of the pixel portion will be explained in detail. Embodiment 1 will be explained with references to FIGS. 2A to 6D.

In FIG. 2A, in addition to the glass substrates such as a barium borosilicate glass or an alumino borosilicate glass, typically the Corning glass #7059 or #1737, plastic substrates that do not have optical anisotropy such as polyethylene terephthalate (PET), polyethylene naphthalate (PEN), and polyether sulfone (PES) may be used for a substrate 201. Further, a quartz substrate and a crystallized glass substrate may also be used.

Then a base film 202 made from an insulating film such as a silicon oxide film, a silicon nitride film, and a silicon nitride oxide film, is formed on a surface of the substrate 201 where a TFT will be formed, in order to prevent the diffusion of impurities from the substrate 201. In Embodiment 1, a silicon nitride oxide film 202a made from $SiH_4$, $NH_3$, and $N_2O$ at a thickness of between 10 and 300 nm (preferably between 50 and 100 nm) and similarly, a hydrogenated silicon nitride oxide film 202b made from $SiH_4$ and $N_2O$ at a thickness of between 50 and 300 nm (preferably between 100 and 150 nm) are formed in lamination by plasma CVD.

The silicon nitride oxide film is formed by using conventional parallel plate type plasma CVD. To prepare the silicon nitride oxide film 202a, $SiH_4$ is introduced into the reaction chamber at 10 SCCM, $NH_3$ at 100 SCCM, and $N_2O$ at 20 SCCM, the substrate temperature is set to 325° C., the reaction pressure is set to 40 Pa, the electric discharge power density is set to 0.41 W/cm², and the electric discharge frequency is set to 60 MHz. On the other hand, to prepare the hydrogenated silicon nitride oxide film 202b, $SiH_4$ is introduced into the reaction chamber at 5 SCCM, $N_2O$ at 120 SCCM, and $H_2$ at 125 SCCM, the substrate temperature is set to 400° C., the reaction pressure is set to 20 Pa, the electric discharge power density is set to 0.41 W/cm², and the electric discharge frequency is set to 60 MHz. These films can be formed in succession by only changing the substrate temperature and changing the reaction gasses.

Further, the silicon nitride oxide film 202a is formed so that the internal stress thereof becomes compression stress when the substrate is regarded as the center. Although the hydrogenated silicon nitride oxide film 202b is also made to have the internal stress in the same direction, the stress in the absolute value is made smaller than that of the silicon nitride oxide film 202a.

Next, a semiconductor film 203 having an amorphous structure is formed to a thickness of 25 to 80 nm (preferably between 30 and 60 nm) by a known method such as plasma CVD or sputtering. For example, a 55 nm thick amorphous silicon film is formed by plasma CVD. Furthermore, at this time, both the base film 202 and the amorphous semiconductor layer 203 may be formed in succession. For example, after successively depositing the silicon nitride oxide film 202a and the hydrogenated silicon nitride oxide film 202b by plasma CVD as stated above, if the reaction gasses are changed from $SiH_4$, $N_2O$, and $H_2$ to $SiH_4$ and $H_2$, or only to $SiH_4$, then the films can be formed successively without once being exposed to the atmosphere. As a result, it becomes possible to prevent contamination of the surface of the hydrogenated silicon nitride oxide film 202b, and fluctuation in the characteristics of the manufactured TFTs, and change in the threshold voltage thereof, can be reduced.

Figure 5A:
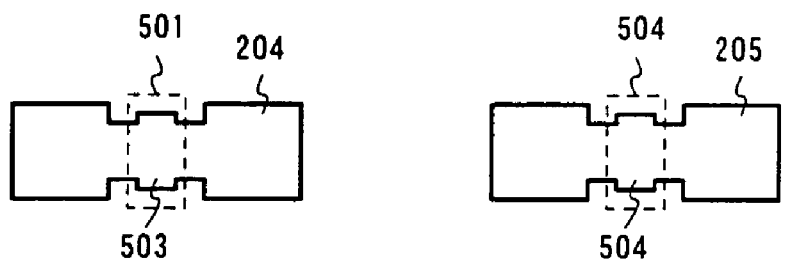
FIGS. 5A to 5D are diagrams showing a process of manufacturing a CMOS circuit.
Figure 5B:
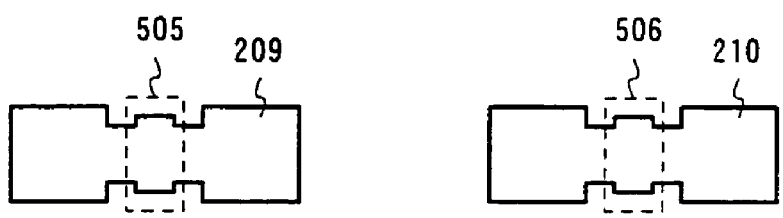
Figure 6A:
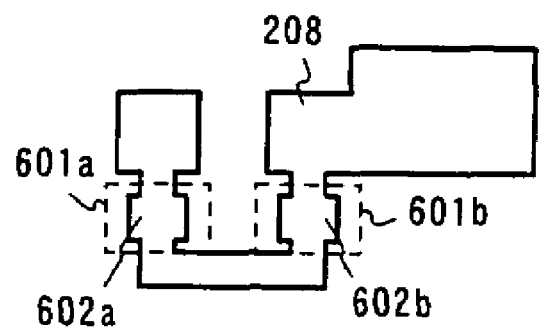
FIGS. 6A to 6D are diagrams showing a process of manufacturing a pixel TFT.
Figure 6B:
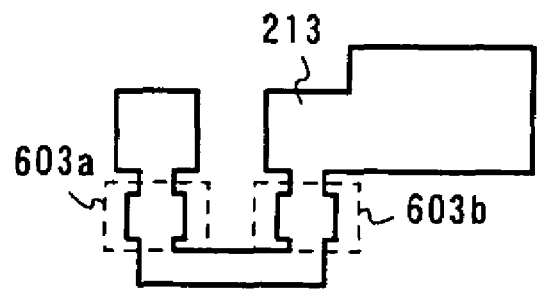

Then, as shown in FIG. 2B, island shape semiconductor films 204 to 208 are formed from the semiconductor layer 203 having an amorphous structure. FIG. 5A is a top view of island shape semiconductor films 204 and 205 in this state, similarly, FIG. 6A is top view of an island shape semiconductor film 208.

Convex portions 503 and 504, which become origins of crystal growth during laser crystallization, are formed in regions 501 and 502 containing a "channel forming region after TFT completion", in each of the island shape semiconductor films 204 and 205, as shown in FIG. 5A. Further, as shown in FIG. 6A, convex portions 602a and 602b, which become origins of crystal growth during laser crystallization, are similarly formed in regions 601a and 601b containing "channel forming regions after TFT completion", in the island shape semiconductor film 208.

Convex portions are of course formed similarly to FIG. 5A in the island shape semiconductor films 206 and 207, but that explanation is omitted.

Figure 7A:
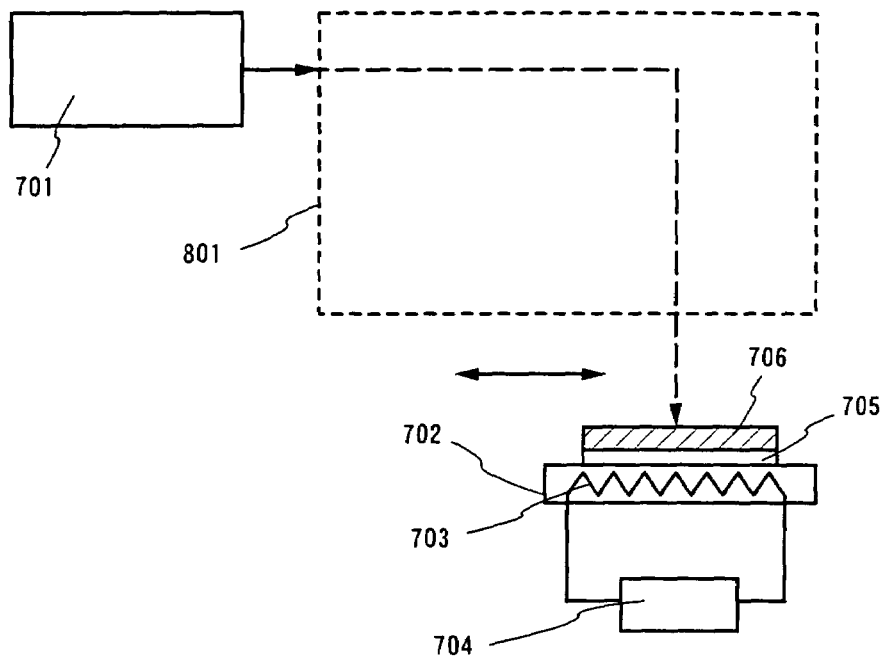
FIGS. 7A to 7B are diagrams showing the structure of a laser apparatus.
Figure 7B:
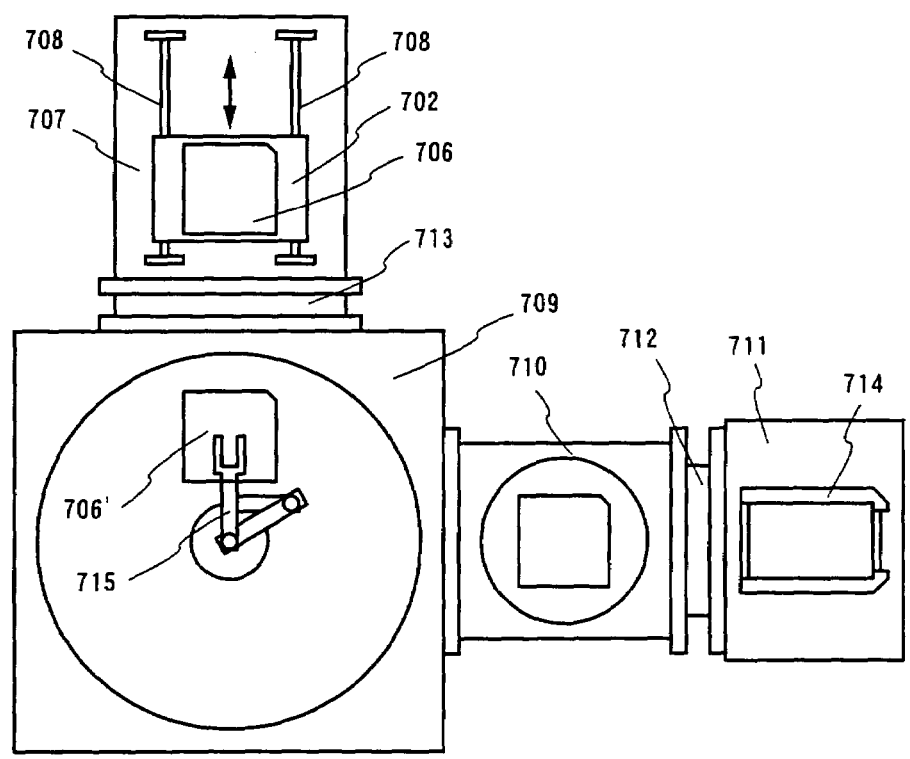

A process of crystallizing the island shape semiconductor films 204 to 208 is performed next. Crystallization of the island shape semiconductor films 204 to 208 is performed in Embodiment 1 by excimer laser light (308 nm wavelength) using XeCl as an excitation gas. The laser apparatus shown in FIGS. 7A and 7B is used when performing laser crystallization of the island shape semiconductor films 204 to 208 in Embodiment 1. The laser apparatus is characterized in that both the top surface and the bottom surface of the island shape semiconductor films are irradiated by laser light.

The laser apparatus shown in FIG. 7A has a laser 701, an optical system 801 for processing the laser light from the emission source laser 701 into a linear shape, and a stage 702 to which a transparent substrate is fixed. The stage 702 is prepared with a heater 703 and a heater controller 704, and the temperature of the substrate can be maintained in a temperature range from room temperature up to 550° C. Further, a reflecting body 705 is formed on the stage 702, and a substrate 706 on which the island shape films are formed is placed on the reflecting body 705.

Further, the substrate 706 fixed to the stage 702 is arranged in a reaction chamber 707, as shown in FIG. 7B, and the linear shape laser light from the emission source laser 701 is irradiated. The inside of the reaction chamber can be made into a reduced pressure state or into an inert gas atmosphere by an evacuation system or a gas system not shown in the figures, and the semiconductor films can be heat treated to between 100 and 550° C. without contamination.

Furthermore, the stage 702 can be moved within the reaction chamber along guide rails 708, and the entire surface of the substrate can be irradiated by the linear shape laser light. The laser light is irradiated from a quartz window, not shown in the figures, which is formed on the top surface of the substrate 706. In addition, a transfer chamber 709, an intermediate chamber 710, and a load-unload chamber 711 are connected to the reaction chamber 707 in FIG. 7B, and each chamber is separated by partitioning valves 712 and 713.

A cassette 714 which is capable of maintaining a plurality of substrates is formed in the load-unload chamber 711, and the substrates are conveyed by a robot 715 provided in the transfer chamber 709. A substrate 706' shows a substrate being conveyed. Laser annealing can thus be performed successively in a reduced pressure state or in an inert gas atmosphere by this type of structure.

Figure 8A:
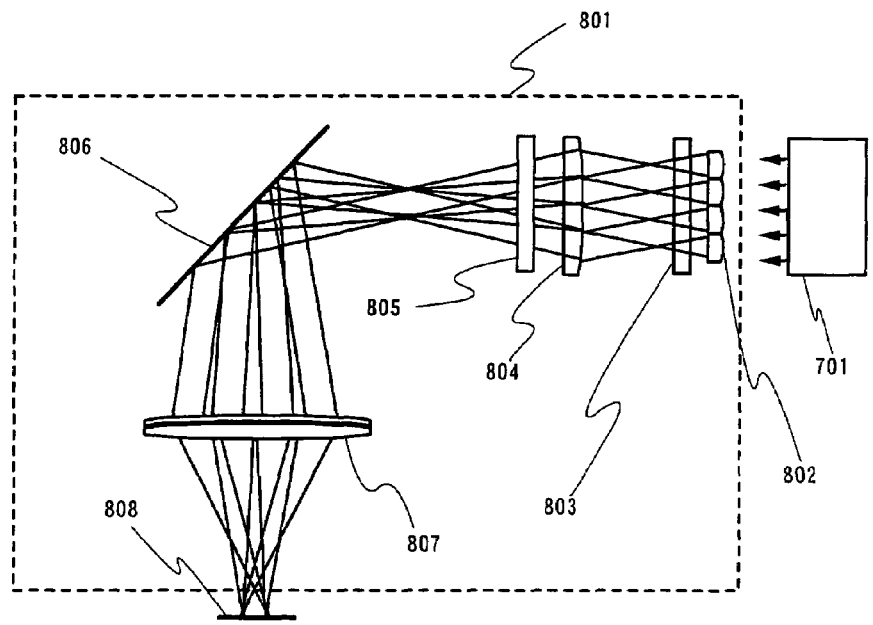
FIGS. 8A to 8B are diagrams showing the structure of an optical system of a laser apparatus.
Figure 8B:
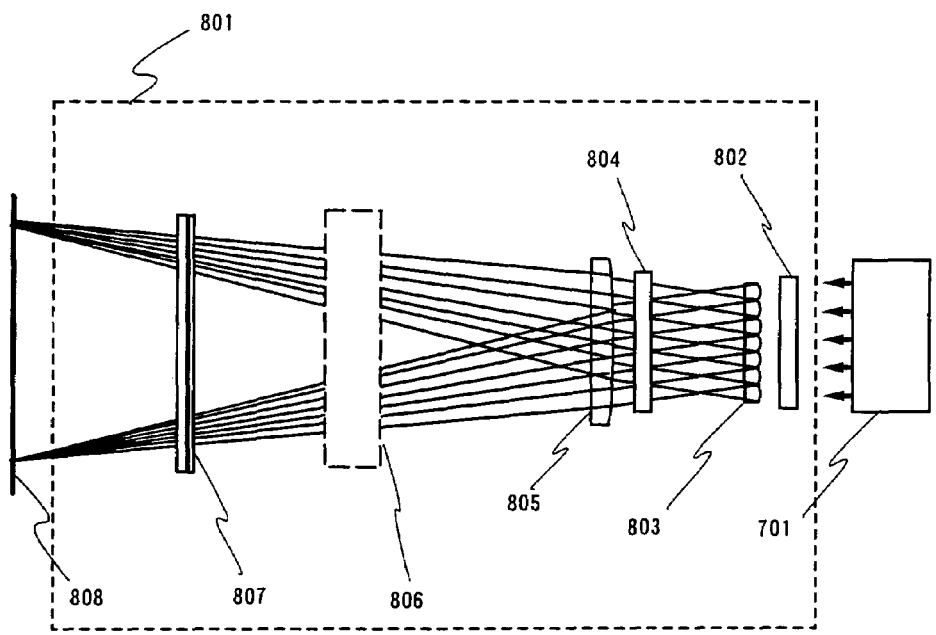

The structure of the optical system 801 for forming laser light into a linear shape is explained next using FIGS. 8A and 8B. FIG. 8A is a diagram of the optical system 801 seen from the side, and FIG. 8B is a diagram of the optical system 801 seen from above.

The laser light from the laser 701 as the emission source is partitioned in the vertical direction by a cylindrical lens array 802. The partitioned laser light is additionally partitioned in the horizontal direction by a cylindrical lens array 803. In other words, the laser light is ultimately partitioned into a matrix state by the cylindrical lens arrays 802 and 803.

The laser light is then condensed together by a cylindrical lens 804. The laser light passes through a cylindrical lens 805 immediately after the cylindrical lens 804. It is next reflected by a mirror 806, and after passing through a cylindrical lens 807, arrives at an irradiation surface 808.

At this point the laser light projected on the irradiation surface 808 displays a linear shape on the irradiation surface. In other words, this means that the cross sectional shape of the laser light which has passed through the cylindrical lens 807 has become linear shaped. The homogenization in the width direction (short direction) of the laser light transformed into a linear shape is performed by the cylindrical lens array 802, the cylindrical lens 804, and the cylindrical lens 807. Further, the homogenization in the length direction (long direction) of the above laser light is performed by the cylindrical lens array 803 and the cylindrical lens 805.

Further, in addition to the optical system explained here, the optical system recorded in Japanese Patent Application Laid-open No. Hei 10-064842 may also be used.

Figure 9:
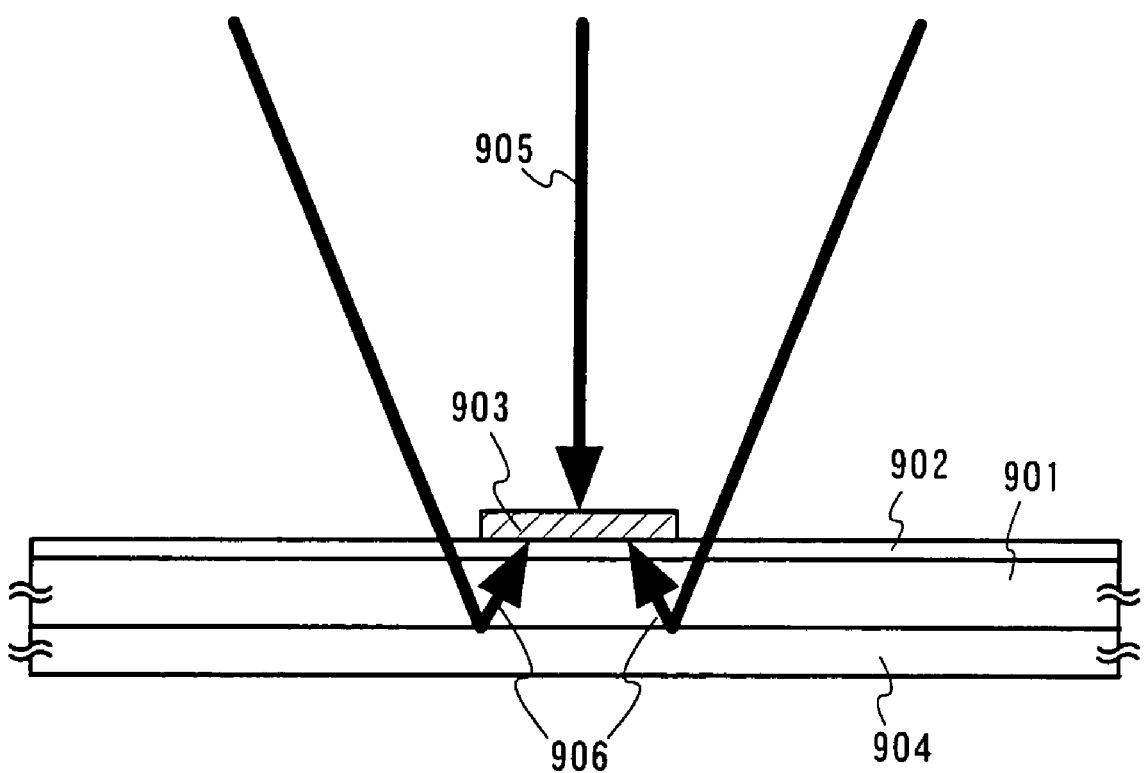
FIG. 9 is a diagram illustrating a laser annealing method.

Next, a structure for irradiating laser light to the top surface and the bottom surface of the processing film formed on the substrate is explained using FIG. 9. Shown in FIG. 9 is a diagram showing the positional relationship of the substrate 706 and the reflecting body 705 of FIGS. 7A and 7B. Reference numeral 901 denotes a transmitting substrate, and on its surface an insulating film 902 and an amorphous semiconductor film (or a microcrystalline semiconductor film) 903 are formed. Further, a reflecting body 904 is arranged under the transmitting substrate 901 in order to reflect the laser light.

In crystallization of the amorphous semiconductor film in Embodiment 1, the laser light is irradiated to the top surface of the amorphous semiconductor film (the surface on which thin films overlap) and the bottom surface of the amorphous semiconductor film (the surface opposite the top surface) at the same time, and the effective energy strength of the laser light irradiated on the top surface (hereafter referred to as primary laser light) and the effective energy strength of the laser light irradiated on the bottom surface (hereafter referred to as secondary laser light) differ.

In other words, when the effective energy strength of the primary laser light is taken as $I_0$, and the effective energy strength of the secondary laser light is taken as $I_0'$, the laser light irradiated is characterized in that a relationship of $0<(I_0'/I_0)<1$, or a relationship of $1<(I_0'/I_0)$ is formed for the ratio of effective energies $(I_0'/I_0)$. Of course, $I_0$ and $I_0' \neq 0$. It is preferable that the effective energy strength ratio $(I_0'/I_0)$ be from 0.2 to 0.9 (even better between 0.3 and 0.7) at this point.

Note that, throughout this specification, "effective energy strength" refers to the energy strength of the laser light when it reaches the top surface or the bottom surface of the amorphous semiconductor film, and is defined as the energy strength after considering energy losses due to things such as transmission and reflection (the units are those of density, expressed as $mJ/cm^2$). It is not possible to measure the effective energy strength, but provided that the media which exists along the laser light path is understood, it can be easily obtained from a calculation of the reflectivity and the transmittivity.

A glass substrate, a quartz substrate, a crystallized glass substrate, or a plastic substrate can be used as the transmitting substrate 901. It is possible to regulate the effective energy strength of the secondary laser light by the transmitting substrate 901 itself. Further, an insulating film containing silicon, such as a silicon oxide film or a silicon nitride oxide film ($SiO_xN_y$) may be used as the insulating film 902, and the effective energy strength of the secondary laser light may also be regulated by the insulating film 902. The amorphous semiconductor film 903 may include, in addition to the amorphous silicon film, a compound semiconductor film such as an amorphous silicon germanium film.

Further, the reflecting body 904 may be a substrate on which a metallic film is formed on the surface (the laser light reflecting surface), or may be a substrate made from a metallic element. In this case, any material may be used as the metallic film. A metallic film containing an element selected from the group consisting of silicon (Si), aluminum (Al), silver (Ag), tungsten (W), titanium (Ti), and tantalum (Ta) is typically used. For example, tungsten nitride (WN), titanium nitride (TiN), and tantalum nitride (TaN) may be used.

In addition, the reflecting body 904 may be formed contacting the transmitting substrate 901, or may be formed separated from the reflecting body 904. Further, as a substitute for arranging the reflecting body 904, a metallic film such as those stated above may be formed in direct contact with the bottom surface (the surface on the opposite side as the top surface) of the substrate 901. Whichever is used, the effective energy strength of the secondary laser light can be regulated by the reflectivity of the reflecting body 904. Furthermore, when the reflecting body 904 is placed separated from the transmitting substrate 901, it is also possible to control the effective energy strength of the secondary laser light by a gas filling the gap between the two.

The laser light which has been transformed into a linear shape via the optical system 801 explained by FIGS. 8A and 8B is then irradiated on the amorphous semiconductor film 903. The irradiation of the laser light transformed into a linear shape is performed by scanning.

It is important to satisfy a relationship of $0<(I_0'/I_0)<1$, or a relationship of $1<(I_0'/I_0)$, for the effective energy strength ratio $(I_0'/I_0)$ between primary laser light 905 passing through the cylindrical lens 807 and irradiated on the top surface of the amorphous semiconductor film 905, and secondary laser light 906 reflected once by the reflecting body 904 and irradiated on the bottom surface of the amorphous semiconductor film 903. In order to do so, it is preferable that the reflectivity of the reflecting body 904 be from 20 to 80% with respect to the laser light.

Further, the laser light which has passed through the cylindrical lens 807 possesses an angle of incidence of between 45 and 90° with respect to the substrate surface by being condensed. Therefore, the secondary laser light 906 also wraps around the bottom surface side of the amorphous semiconductor film 903 and is irradiated. Furthermore, by forming an undulating portion on the reflecting surface of the reflecting body 904 and scattering the laser light, the secondary laser light 906 can be obtained with greater efficiency.

Crystallization of the amorphous semiconductor films 204 to 208 is performed using the laser apparatus and the laser irradiation method as above, forming island shape semiconductor films 209 to 213 made from crystalline semiconductor films. Regions shown by reference numerals 505 and 506 in FIG. 5B at this point denote regions having large grains, in accordance with the effect of the present invention, compared to other regions. Further, regions shown by reference numerals 603a and 603b similarly denote regions having large grains, in accordance with the effect of the present invention, in comparison with other regions.

Furthermore, for cases when the energy density of the irradiated laser is high, a phenomenon is seen in which the entire island shape semiconductor films become smaller on the order of 0.1 to 0.5 μm toward the inside. This is thought to be because of shrinkage due to the film becoming denser, or due to surface tension, when the island shape semiconductor films are melted by the laser light. If this phenomenon is constructively used, then it is possible to remove convex portions, formed as origins of crystal growth in the island shape semiconductor films 204 to 208, at the same time the island shape semiconductor films 209 to 213 are formed.

A mask layer 214 is formed next from a 50 to 100 nm thick silicon oxide film made by plasma CVD or sputtering, covering the island shape semiconductor films 209 to 213. An impurity element which imparts p-type conductivity may be added at a concentration of $1 \times 10^{16}$ to $5 \times 10^{17}$ atoms/cm$^3$ to the entire surface of the island shape semiconductor films in this state with the aim or controlling the threshold voltage ($V_{th}$) of the TFTs.

Periodic table group 13 elements such as boron (B), aluminum (Al), and gallium (Ga) are known as impurity elements which impart p-type conductivity with respect to semiconductors. Ion injection and ion doping can be used as the addition method, but the ion doping method is suitable for processing large surface area substrates. Boron (B) is added with ion doping by using diborane ($B_2H_6$) as a source gas. This type of impurity element injection is not always necessary and omitting the impurity element will not cause interference, but the impurity element is particularly effective in containing the threshold voltage of the n-channel TFT within a predetermined range.

Resist masks 215a to 215e are formed next, and an impurity element which imparts n-type conductivity is selectively added to the island shape semiconductor films 210, 212, and 213. A periodic table group 15 element, typically phosphorous (P) or arsenic (As) may be used as the n-type conductivity imparting impurity element, and phosphorous is added here by ion doping using phosphine ($PH_3$).

The impurity regions formed may be taken as low concentration n-type impurity regions 216 and 217 by setting the phosphorous (P) concentration in the range of $2 \times 10^{16}$ to $5 \times 10^{19}$ atoms/cm³. The concentration of the impurity element for imparting n-type conductivity contained in the impurity regions 216 and 217 formed is expressed as (n⁻) throughout this specification. Further, an impurity region 218 is a semiconductor layer for forming a storage capacitance of a pixel portion, and phosphorous (P) is also added to this region at the same concentration. (See FIG. 2D.)

Next, a step of activating the added impurity element is carried out. Activation can be made by a heat treatment in a nitrogen atmosphere at 500 to 600° C. for 1 to 4 hours, or a laser activation method. Both may be carried out at the same time. In the case of the method of the laser activation, an excimer laser light may be used. Incidentally, irradiation conditions of the laser light are not limited, but the user may suitably determine. This step may be performed while remaining the mask layer 214 or may be performed after the removal of the mask layer 214.

In FIG. 2E, a gate insulating film 219 is formed of an insulating film having a thickness of 40 to 150 nm and containing silicon by using a plasma CVD or sputtering. For example, the gate insulating film 219 may be formed of a silicon nitride oxide film having a thickness of 120 nm is formed. Besides, in a silicon nitride oxide film formed by adding $O_2$ to $SiH_4$ and $N_2O$, a fixed charge density in the film is lowered, and it is a preferable material for this usage. Of course, the gate insulating film 219 is not limited to such a silicon nitride oxide film, but other insulating films containing silicon may be used as a single layer or a laminate structure.

Then, as shown in FIG. 2E, a heat resistant conductive layer for forming a gate electrode is formed on the gate insulating film 219. Although the heat resistant conductive layer may be formed of a single layer, a laminate structure made of plural layers, such as two layers or three layers, may be formed, as needed. It is appropriate that the heat resistant conductive material like this is used and such a structure is adopted that a conductive layer (A) 220 made of a conductive metal nitride film and a conductive layer (B) 221 made of a metal film are laminated.

The conductive layer (B) 221 may be formed of an element selected from tantalum (Ta), titanium (Ti), molybdenum (Mo), and tungsten (W), an alloy containing the foregoing elements as its main ingredient, or an alloy film of a combination of the elements (typically Mo—W alloy film, Mo—Ta alloy film). The conductive layer (A) 220 is formed of tantalum nitride (TaN), tungsten nitride (WN), titanium nitride (TiN), molybdenum nitride (MoN) or the like. Besides, the conductive layer (A) 220 may also be formed of tungsten silicide, titanium silicide, or molybdenum silicide.

With respect to the conductive layer (B) 221, in order to lower the resistance, it is preferable to decrease the concentration of the contained impurity, and especially, it is appropriate that the oxygen concentration is made 30 ppm or less. For example, with respect to tungsten (W), when the oxygen concentration is made 30 ppm or less, a specific resistance value of 20 μΩcm or less can be realized.

It is appropriate that the thickness of the conductive layer (A) 220 is made 10 to 50 nm (preferably 20 to 30 nm), and the thickness of the conductive layer (B) 221 is made 300 to 400 nm (preferably 250 to 350 nm). In the case where the gate electrode is formed of the W film, the conductive layer (A) 220 is formed of a WN film having a thickness of 50 nm by a sputtering method using W as a target and introducing an argon (Ar) gas and nitrogen ($N_2$) gas, and the conductive layer (B) 221 is formed of a W film having a thickness of 250 nm. As another method, the W film can also be formed by a thermal CVD method using tungsten hexafluoride ($WF_6$).

In any event, in order to use it as the gate electrode, it is necessary to decrease the resistance, and it is desirable to make the resistivity of the W film 20 μΩcm or less. Although the resistivity of the W film can be decreased by enlarging the crystal grain, in the case where many impurity elements such as oxygen are contained in the W film, crystallization is blocked and the resistance is increased. From this, in the case of the sputtering method, when a W target of purity of 99.9999% is used, and the W film is formed by sufficiently paying attention so that an impurity is not mixed from a vapor phase during the film formation, the resistivity of 9 to 20 μΩcm can be realized.

On the other hand, in the case where a TaN film is used for the conductive layer (A) 220 and a Ta film is used for the conductive layer (B) 221, they can be formed similarly by the sputtering method. The TaN film is formed by using a target of Ta and a mixed gas of Ar and nitrogen as a sputtering gas, and the Ta film is formed by using Ar as the sputtering gas. If a suitable amount of Xe or Kr is added to the sputtering gas, the internal stress of the formed film is relieved, and peeling of the film can be prevented. The resistivity of α-phase Ta film is about 20 μΩcm and can be used for the gate electrode. However, the resistivity of β-phase Ta film is about 180 μΩcm and is not suitable for the gate electrode. Since the TaN film has a crystal structure close to the α-phase, if the Ta film is formed thereon, the α-phase Ta film can be easily obtained. Although not shown, it is effective to form a silicon film having a thickness of about 2 to 20 nm and doped with phosphorus (P) under the conductive layer (A) 220. By this, the improvement of adhesion of the conductive film formed thereon and prevention of oxidation are realized, and at the same time, it is possible to prevent a trace amount of alkali metal element contained in the conductive layer (A) 220 or the conductive layer (B) 221 from diffusing. In any event, it is preferable that the resistivity of the conductive layer (B) 221 is made in the range of 10 to 50 μΩcm.

Figure 3A:
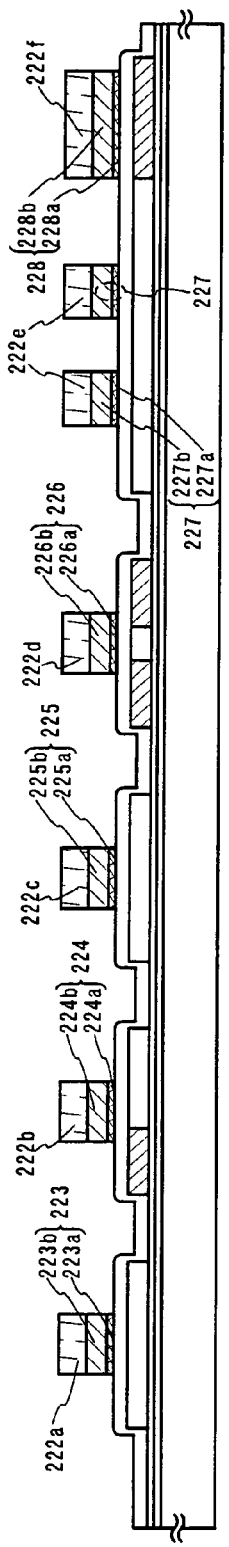
FIGS. 3A to 3D are diagrams showing a process of manufacturing an active matrix type liquid crystal display device.

Then, resist masks 222a to 222f are formed by using the photolithography technique, and the conductive layer (A) 220 and the conductive layer (B) 221 are simultaneously etched to form gate electrodes 223 to 227 and a capacitor wiring 228. In the gate electrodes 223 to 227 and the capacitor wiring 228, portions 223a to 227a made of the conductive layer (A) and portions 223b to 227b made of the conductive layer (B) are integrally formed (FIG. 3A).

Figure 5C:
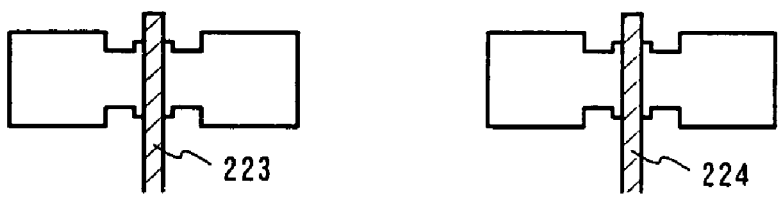
Figure 6C:
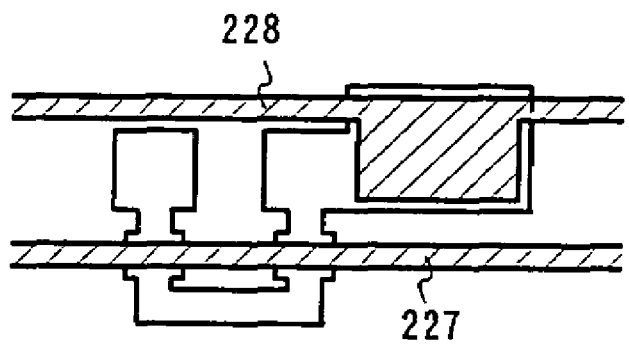

The positional relation among the island shape semiconductor films 209 and 210 and the gate electrodes 223 and 224 in this state is shown in FIG. 5C. Similarly, the relation among the island shape semiconductor film 213, the gate electrode 227, and the capacitor wiring 228 is shown in FIG. 6C. In FIGS. 5C and 6C, the gate insulating film 219 is omitted.

Although a method of etching the conductive layer (A) and the conductive layer (B) may be suitably selected by the user, in the case where the layer is formed of a material containing W as its main ingredient as described above, it is desirable to use a dry etching method using high density plasma in order to carry out an etching at high speed and with high precision. As a method of obtaining the high density plasma, a microwave plasma or inductively coupled plasma (ICP) etching device may be used.

For example, in the etching method of W using the ICP etching device, as an etching gas, two kinds of gases of $CF_4$ and $Cl_2$ are introduced in a reaction chamber, the pressure is made 0.5 to 1.5 Pa (preferably 1 Pa), and the high frequency (13.56 MHz) power of 300 to 1000 W is applied to an inductively coupled portion. At this time, the high frequency power of 20 W is applied to the stage where the substrate is put, and it is charged to a negative potential by self-bias, so that a positive ion is accelerated and an anisotropic etching can be carried out. By using the ICP etching device, even the hard metal film of W or the like can also be etched at an etching rate of 2 to 5 nm/second. In order to carry out the etching without leaving the residue, it is appropriate that an etching time is increased at a ratio of about 10 to 20% to carry out over etching. However, at this time, it is necessary to pay attention to a selection ratio of etching to the under layer. For example, since the selection ratio of the silicon nitride oxide film (gate insulating film 219) to the W film is 2.5 to 3, the surface where the silicon nitride oxide film is exposed by such an over etching process, is etched by about 20 to 50 nm and became substantially thin.

Figure 3B:
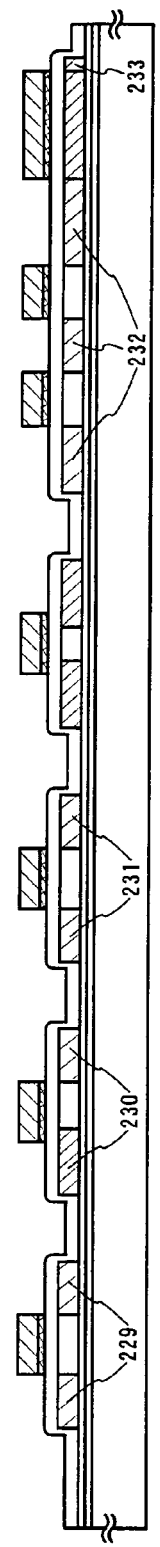

Then, in order to form an LDD region in the n-channel TFTs of the pixel TFT, a step of adding an impurity element to give an n type (n⁻ doping step) is carried out. Here, the impurity element to give the n type is added by an ion doping method using the gate electrodes 223 to 227 as masks in a self-aligned manner. The concentration of phosphorus (P) added as the impurity element to give the n type is within the range of $1 \times 10^{16}$ to $5 \times 10^{19}$ atoms/cm$^3$. In this way, as shown in FIG. 3B, low concentration n-type impurity regions 229 to 233 are formed in the island shape semiconductor films.

Figure 3C:
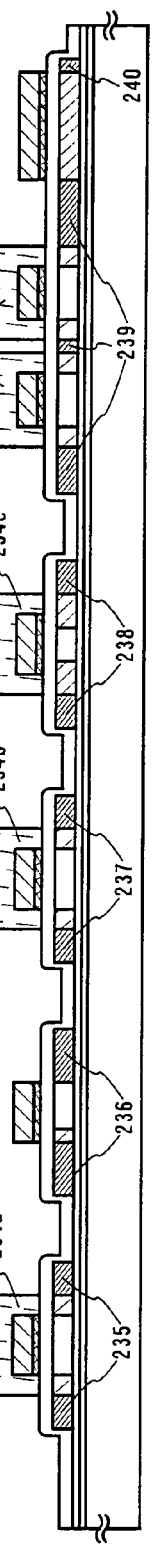

Next, in the n-channel TFTs, high concentration n-type impurity regions functioning as source regions or drain regions are formed (n⁺ doping step). First, resist masks 234a to 234d are formed using photomasks, and an impurity element to give the n type is added to form high concentration n-type impurity regions 235 to 240. Phosphorus (P) is used as the impurity element to give the n type in this region, and an ion doping method using phosphine ($PH_3$) is carried out so that its concentration becomes within the range of $1 \times 10^{20}$ to $1 \times 10^{21}$ atoms/cm$^3$ (FIG. 3C).

Then, in the island-like semiconductor layers 209 and 211 for forming the p-channel TFTs, high concentration p-type impurity regions 242 and 243 as source regions or drain regions are formed. Here, the gate electrodes 223 and 225 are used as masks, and an impurity element to give the p type is added to form the high concentration p-type impurity regions in a self-aligning manner. At this time, resist masks 241a to 241c are formed to cover all the surfaces of the island shape semiconductor films 210, 212, and 213 for forming the n-channel TFTs.

Figure 3D:
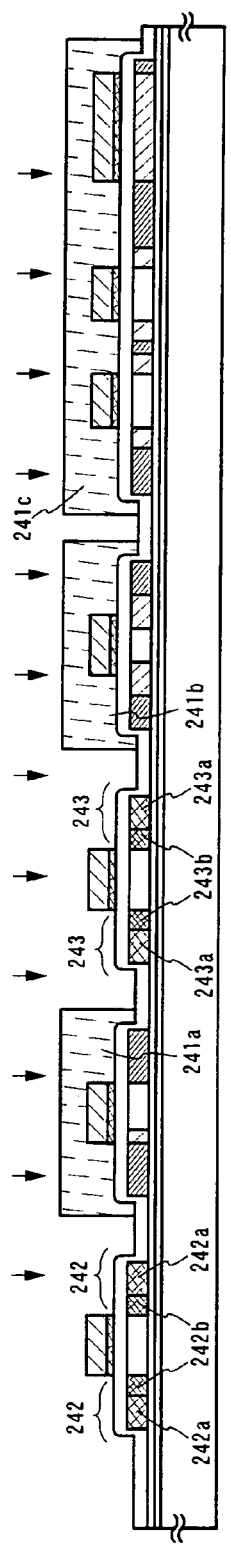

The high concentration p-type impurity regions 242 to 243 are formed by an ion doping method using diborane ($B_2H_6$). The boron (B) concentration in this region is made $3 \times 10^{20}$ to $3 \times 10^{21}$ atoms/cm$^3$ (FIG. 3D).

In the high concentration p-type impurity regions 242 and 243, phosphorus (P) is added in the prior steps, and the high concentration p-type impurity regions 242a and 243a contain phosphorus at a concentration of $1 \times 10^{20}$ to $1 \times 10^{21}$ atoms/cm$^3$, and the high concentration p-type impurity regions 242b and 243b contain phosphorus at a concentration of $1 \times 10^{16}$ to $5 \times 10^{19}$ atoms/cm$^3$. However, since the concentration of boron (B) added in this step is made 1.5 to 3 times as high as that of phosphorus, there occurs no problem in functioning as the source region and drain region of the p-channel TFT.

Thereafter, as shown in FIG. 4A, a protective insulating film 244 is formed from gate electrodes and gate insulating films. The protective insulating film may be formed of a silicon oxide film, a silicon nitride oxide film, a silicon nitride film, or a laminate film of a combination of these. In any event, the protective insulating film 244 is formed of an inorganic insulator material. The thickness of the protective insulating film 244 is made 100 to 300 nm.

Here, in the case where the silicon oxide film is used, the film can be formed by a plasma CVD method in which discharge is made under the conditions that tetraethyl orthosilicate (TEOS) and $O_2$ are mixed, the reaction pressure is made 40 Pa, the substrate temperature is made 300 to 400° C., and the high frequency (13.56 MHz) power density is 0.5 to 0.8 W/cm$^2$. In the case where the silicon nitride oxide film is used, the film may be formed of a silicon nitride oxide film fabricated from $SiH_4$, $N_2O$, and $NH_3$ by the plasma CVD method, or a silicon nitride oxide film fabricated from $SiH_4$ and $N_2O$. In this case, the film can be formed under fabricating conditions that the reaction pressure is 20 to 300 Pa, the substrate temperature is 300 to 400° C., and the high frequency (60 MHz) power density is 0.1 to 1.0 W/cm$^2$. Besides, a hydrogenated silicon nitride oxide film fabricated from $SiH_4$, $N_2O$, and $H_2$ may be used. Similarly, the silicon nitride film can be fabricated from $SiH_4$ and $NH_3$ by the plasma CVD method.

Thereafter, a step of activating the impurity element to give the n type or p type, which was added at its own concentration, is carried out. This step is carried out by a furnace annealing using an electric furnace. In addition, a laser annealing or a rapid thermal annealing (RTA method) can be used. The furnace annealing is carried out in a nitrogen atmosphere containing oxygen of a concentration of 1 ppm or less, preferably 0.1 ppm or less, at 400 to 700° C., typically 500 to 600° C. In this embodiment, a heat treatment at 550° C. for 4 hours is carried out. In the case where a plastic substrate with a low heat resistance temperature is used as the substrate 201, it is preferable to use the laser annealing method (FIG. 4B).

After the step of activation, further, a heat treatment at 300 to 450° C. for 1 to 12 hours is carried out in an atmosphere containing hydrogen of 3 to 100%, and a step of hydrogenating the island shape semiconductor film is carried out. This step is a step of terminating dangling bonds in the island shape semiconductor film by thermally excited hydrogen. As another means of hydrogenating, plasma hydrogenating (using hydrogen excited by plasma) may be carried out. Besides, by a heat treatment at 300 to 450° C., the island shape semiconductor film may be hydrogenated by diffusing hydrogen of the hydrogenated silicon nitride oxide film of the base film 202 and the silicon nitride oxide film of the protective insulating film 244.

After the steps of activation and hydrogenating are ended, an interlayer insulating film 245 made of organic insulating material is formed to an average thickness of 1.0 to 2.0 µm. As the organic insulating material, polyimide, acryl, polyamide, polyimidoamid, BCB (benzocyclobutene), or the like can be used. For example, in the case where polyimide of a type which is thermally polymerized after application onto a substrate is used, a clean oven is used and sintering is made at 300° C. to form the film. In the case where acryl is used, a two-liquid type is used, and after a main material and a hardening agent are mixed, a spinner is used to apply it onto the entire surface of a substrate, and then, preheating at 80° C.

for 60 seconds is carried out with a hot plate, and further, a clean oven is used and sintering at 250° C. for 60 minutes is carried out to form the film.

The interlayer insulating film is formed of the organic insulating material, so that the surface can be excellently flattened. Besides, since the organic insulating material has generally low dielectric constant, parasitic capacitance can be lowered. However, since it has a hygroscopic property and is not suitable for a protective film, as in this example, it is preferable that the material is used in combination with the silicon oxide film, silicon nitride oxide film, silicon nitride film, or the like which are formed as the protective insulating film 244.

Thereafter, a photomask is used to form a resist mask of a predetermined pattern, and contact holes reaching source regions or drain regions formed in the respective island shape semiconductor films are formed. The contact holes are formed by a dry etching method. In this case, a mixed gas of $CF_4$, $O_2$, and He is used as an etching gas, and the interlayer insulating film 245 made of the organic insulating material is first etched, and thereafter, an etching gas is made $CF_4$ and $O_2$, and the protective film 244 is etched. Further, in order to raise the selection ratio to the island shape semiconductor film, an etching gas is changed to $CHF_3$ to etch the gate insulating film 219, so that the contact holes can be excellently formed.

Then, a conductive metal film is formed by a sputtering method or a vacuum evaporation method, a resist mask is formed with the photomask, and source wirings 246 to 250 and drain wirings 251 and 253 are formed by etching. A drain wiring 254 indicates a drain wiring of an adjacent pixel. Here, the drain wiring 253 functions as a pixel electrode. Although not shown, in this example, this electrode is wired in such a manner that a Ti film having a thickness of 50 to 150 nm is formed, a contact to the semiconductor film forming the source or drain region of the island shape semiconductor film is formed, and aluminum (Al) having a thickness of 300 to 400 nm is formed to overlap with the Ti film.

Figure 5D:
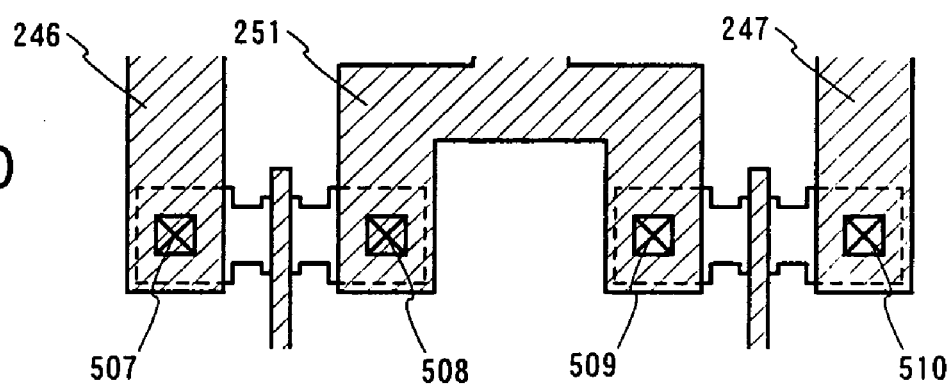

FIG. 5D is a top view showing, in this state, the island shape semiconductor films 209 and 210, the gate electrodes 223 and 224, the source wirings 246 and 247, and the drain wirings 251. The source wirings 246 and 247 are connected to the island shape semiconductor films 209 and 210 at portions 507 and 508 through not-shown contact holes provided in the interlayer insulating film and the protective insulating film, respectively. The drain wiring 251 is connected to the island shape semiconductor films 209 and 210 at portions 508 and 509, respectively.

Figure 6D:
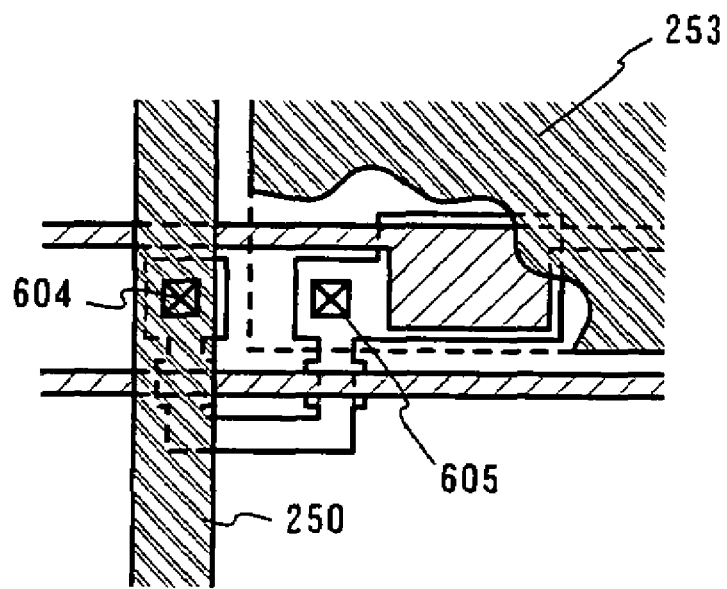

Similarly, FIG. 6D is a top view showing the island shape semiconductor film 213, the gate electrode 227, the capacitor wiring 228, the source wiring 250, and the drain wiring (pixel electrode) 253. The source wiring 250 and the drain wiring 253 are connected through the contact portion 604 and the contact portion 605 to the island shape semiconductor film 213, respectively.

When hydrogenating process is carried out in this state, a preferable result with respect to the improvement of TFT characteristics can be obtained. For example, in an atmosphere containing hydrogen of 3 to 100%, heat treatment at 300 to 450° C. for 1 to 12 hours may be carried out, or a similar effect may be realized by use of plasma hydrogenating method. Besides, with such a heat treatment, hydrogen existing in the protective film 244 and the base film 202 may be diffused and hydrogenated in the island shape semiconductor films 209 to 213. In any case, it is preferable to have a defect density equal to or less than $10^{16}/cm^3$ in the island shape semiconductor films 209 to 213, requiring hydrogen to be provided preferably at a density of approximately $5\times10^{18}$ to $5\times10^{19}$ atoms/cm$^3$ (See FIG. 4C).

In this way, the substrate including the TFTs of the driver circuit and the pixel TFT of the pixel portion on the same substrate can be completed. In the driver circuit, a first p-channel TFT 300, a first n-channel TFT 301, a second p-channel TFT 302, and a second n-channel TFT 303 are formed. In the pixel portion, a pixel TFT 304 and a storage capacitance 305 are formed. In the present specification, for convenience, such a substrate is called an active matrix substrate.

The first p-channel TFT 300 of the driver circuit has a structure including, in the island shape semiconductor film 209, a channel forming region 306, source regions 307a and 307b, and drain regions 308a and 308b, which are made of high concentration p-type impurity regions.

The first n-channel TFT 301 includes, in the island shape semiconductor film 210, a channel forming region 309, an LDD region 310 overlapping with the gate electrode 224, a source region 312, and a drain region 311. In this LDD region, the length of the LDD region overlapping with the gate electrode 224 in the channel length direction is made 0.5 to 3.0 µm, preferably 1.0 to 2.0 µm. By setting the length of the LDD region in the n-channel TFT in this way, a high electric field generated in the vicinity of the drain region is relieved, generation of a hot carrier is prevented, and deterioration of the TFT can be prevented.

Similarly, the second p-channel TFT 302 of the driver circuit has a single drain structure including, in the island shape semiconductor film 211, a channel forming region 313, source regions 314a and 314b, drain regions 315a and 315b, which are made of high concentration p-type impurity regions.

The second n-channel TFT 303 includes, in the island shape semiconductor film 212, a channel forming region 316, LDD regions 317 and 318 partially overlapping with the gate electrode 226, a source region 320, and a drain region 319. The length of the LDD region overlapping with the gate electrode 226 of the TFT is also made 0.5 to 3.0 µm, preferably 1.0 to 2.0 µm. The length of the LDD region not overlapping with the gate electrode is in the channel length direction is made 0.5 to 4.0 µm, preferably 1.0 to 2.0 µm.

The pixel TFT 304 includes, in the island shape semiconductor film 213, channel forming regions 321 and 322, LDD regions 323 to 325, and source or drain regions 326 to 328. The length of the LDD region in the channel length direction is 0.5 to 4.0 µm, preferably 1.5 to 2.5 µm. Further, the storage capacitance 305 is formed of the capacitor wiring 228, an insulating film made of the same material as the gate insulating film, and a semiconductor layer 329 connecting with the drain region 328 of the pixel TFT 304. In FIG. 4C, although the pixel TFT 304 is made a double gate structure, a single gate structure may be adopted, or a multi-gate structure in which a plurality of gate electrodes are provided may be adopted.

Figure 10:
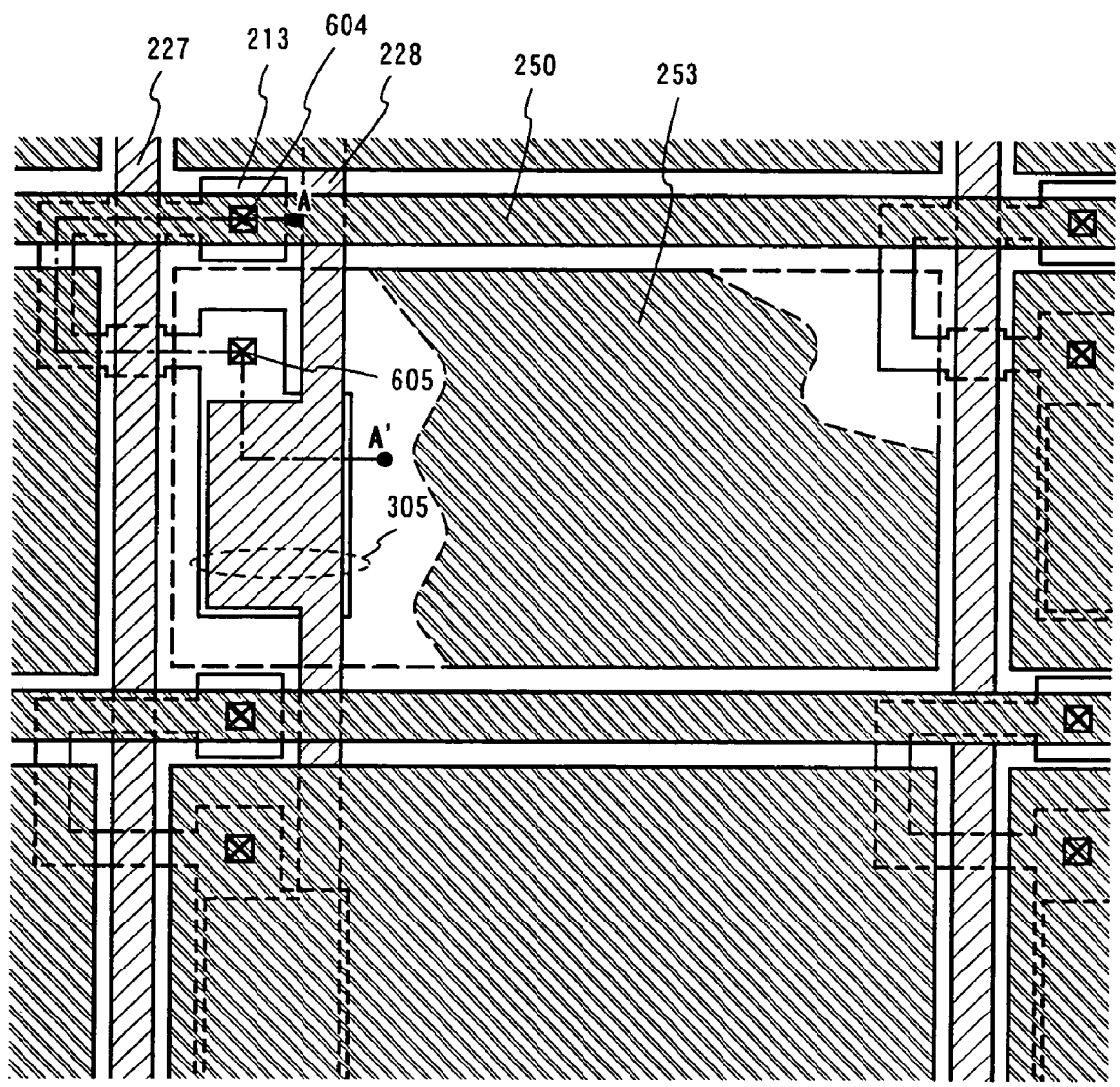
FIG. 10 is a diagram showing a pixel structure.

FIG. 10 is a top view showing substantially one pixel of the pixel portion. A section taken along A-A' in the drawing corresponds to the sectional view of the pixel portion shown in FIG. 4C. In the pixel TFT 304, the gate electrode 227 intersects with the under island shape semiconductor film 213 through a not-shown gate insulating film. Although not shown, the source region, the drain region, and the LDD region are formed in the island shape semiconductor film. Reference numeral 604 designates a contact portion between the source wiring 250 and the source region 326; 605, a contact portion between the drain wiring 253 and the drain region 328. The storage capacitance 305 is formed at a region where the semiconductor layer 329 connected with the drain region 328 of the pixel TFT 304 overlaps with the capacitor wiring 228 through the gate insulating film.

In this way, the active matrix substrate is completed. The manufactured active matrix substrate according to this embodiment, arranges an appropriate structure of the TFT in accordance with the specification of the pixel portion and the driver circuit. Therefore, it is possible to improve the operating performance and the reliability of an electro-optical device using this active matrix substrate.

Further, in this embodiment, the drain wiring 253 electrically connected to the pixel TFT 304 is used as the pixel electrode as is, and is a structure corresponding to the reflection type liquid crystal display device. However, by forming a pixel electrode from transparent conductive film to be electrically connected to the drain wiring 253, it can also correspond to a transmission type liquid crystal display device.

The present embodiment is an example of a manufacturing process of a semiconductor device using the present invention, and is not limited to the material and the numerical range shown in this embodiment. Furthermore, the user may suitably arrange the LDD region, etc.

Embodiment 2

Figure 11A:
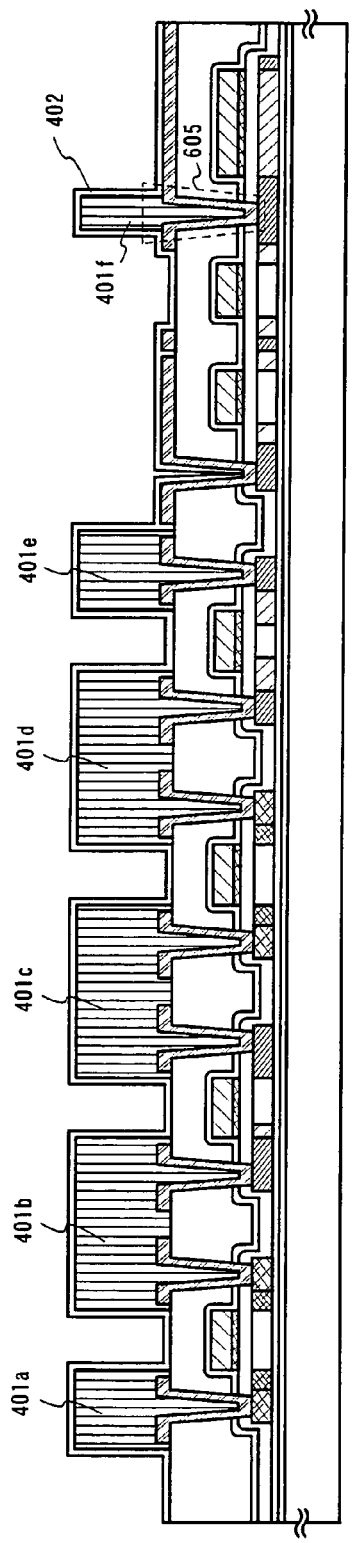
FIGS. 11A to 11B are diagrams showing the sectional structure of an active matrix type liquid crystal display device.

This embodiment gives a description of a process of manufacturing an active matrix type liquid crystal display device using an active matrix substrate that is fabricated in accordance with Embodiment 1. First, as shown in FIG. 11A, spacers 401a to 401f are formed from a resin material by patterning on an active matrix substrate that is in a state illustrated in FIG. 4C. Alternatively, a known spherical silica or the like may be used by dispersing as the spacer.

In this embodiment, as the spacers 401a to 401f made of a resin material, NN 700 produced by JSR is applied by a spinner and is then formed into a given pattern through exposure and development treatment. Further, it is heated in a clean oven or the like at a temperature of 150 to 300° C. to cure. The thus formed spacers may vary in shape depending on exposure conditions and development treatment conditions. A preferable shape for the spacers is a columnar with flat top, because it ensures the mechanical strength as a liquid crystal display panel when the active matrix substrate is bonded to an opposite substrate.

There is no particular limitation on the shape of the spacers and they may take a conical shape, a pyramidal shape, etc. When a conical shape is adopted, for example, specific dimensions of the spacers will be as follows: a height H of 1.2 to 5 µm, a mean radius L1 of 5 to 7 µm, and the ratio between the mean radius L1 and a radius of the base L2 of 1 to 1.5, with a taper angle of ±15° C. or less on their sides.

Any arrangement may be taken for the spacers 401a to 401f. A preferred arrangement is as shown in FIG. 11A, in which the spacers are formed to overlap and cover the contact portion 605 of the drain wiring 253 (pixel electrode) in the pixel portion. Otherwise, the levelness is lost at the contact portion 605 to fail to orientate liquid crystal there properly. By filling the contact portion 605 with the resin for the spacer, discrimination or the like can be prevented.

An orientation film 402 is then formed. Usually, polyimide resin is used for an orientation film of a liquid crystal display element. After forming the orientation film, rubbing treatment is performed so that liquid crystal molecules are orientated with a certain pretilt angle. It is preferable that a region that has not received the rubbing treatment extends equal to or less than 2 µm in the rubbing direction from the ends of the spacers 401a to 401f provided in the pixel portion. In rubbing treatment, static electricity generated often causes trouble. If the spacers 401a to 401f are formed to the extent to cover, at least, the source wiring and the drain wiring on the TFT of the driver circuit, they not only serve their original role as a spacer but also protect the TFT from static electricity in the rubbing process.

A light shielding film 404, an opposite electrode 405 made of a transparent conductive film, and an orientation film 406 are formed on an opposite substrate 403. As the light shielding film 404, Ti, Cr, or Al film is formed to a thickness of 150 to 300 nm. The opposite substrate is then bonded, with a sealing material 407, to the active matrix substrate that has the pixel portion and the driver circuit formed thereon. A filler 408 is mixed in the sealing material 407, and the filler 408 together with the spacers 401a to 401f bonds the opposite substrate and the active matrix substrate with a uniform gap therebetween.

Then a liquid crystal material 409 is injected between the substrates, which are sealed completely with an end-sealing material (not shown). A known liquid crystal material may be used as the liquid crystal material 409. For instance, a material that may be used other than a TN liquid crystal is a thresholdless antiferroelectric mixed liquid crystal exhibiting an electro-optical response with which transmittance varies continuously with respect to the electric field. Some thresholdless antiferroelectric mixed liquid crystal show an electro-optical response that forms a shape of letter V when graphed. For details thereof, see "Characteristics and Driving Scheme of Polymer-Stabilized Monostable FLCD Exhibiting Fast Response Time and High Contrast Ratio with Gray-scale Capability", H. Furue et al., SID, 1998, "A Full-color Thresholdless Antiferroelectric LCD Exhibiting Wide Viewing Angle with Fast Response Time", T. Yoshida et al., 841, SID97 DIGEST, 1.997, "Thresholdless Antiferroelectricity in Liquid Crystals and Its Application to Displays", S. Inui et al., 671-673, J. Mater. Chem. 6 (4), 1996, and U.S. Pat. No. 5,594,569.

Figure 11B:
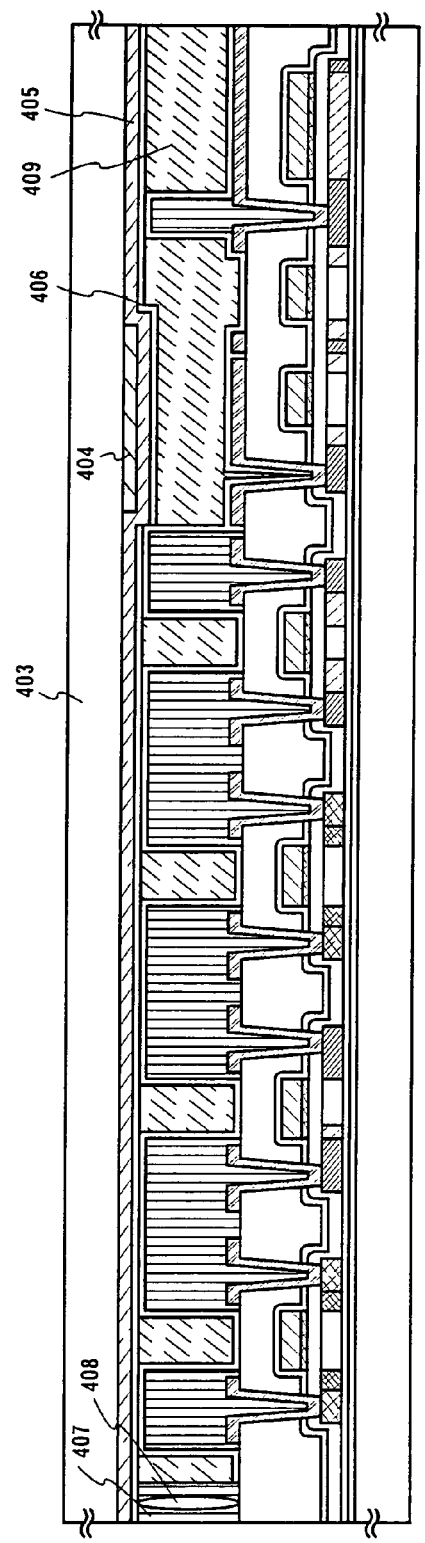

The active matrix type liquid crystal display device shown in FIG. 11B is thus completed. Although the spacers 401a to 401e are formed separately on at least the source wiring and the drain wiring on the TFT of the driver circuit in FIG. 11A, moreover, the spacers may be formed to cover the entire surface of the driver circuit.

Figure 12:
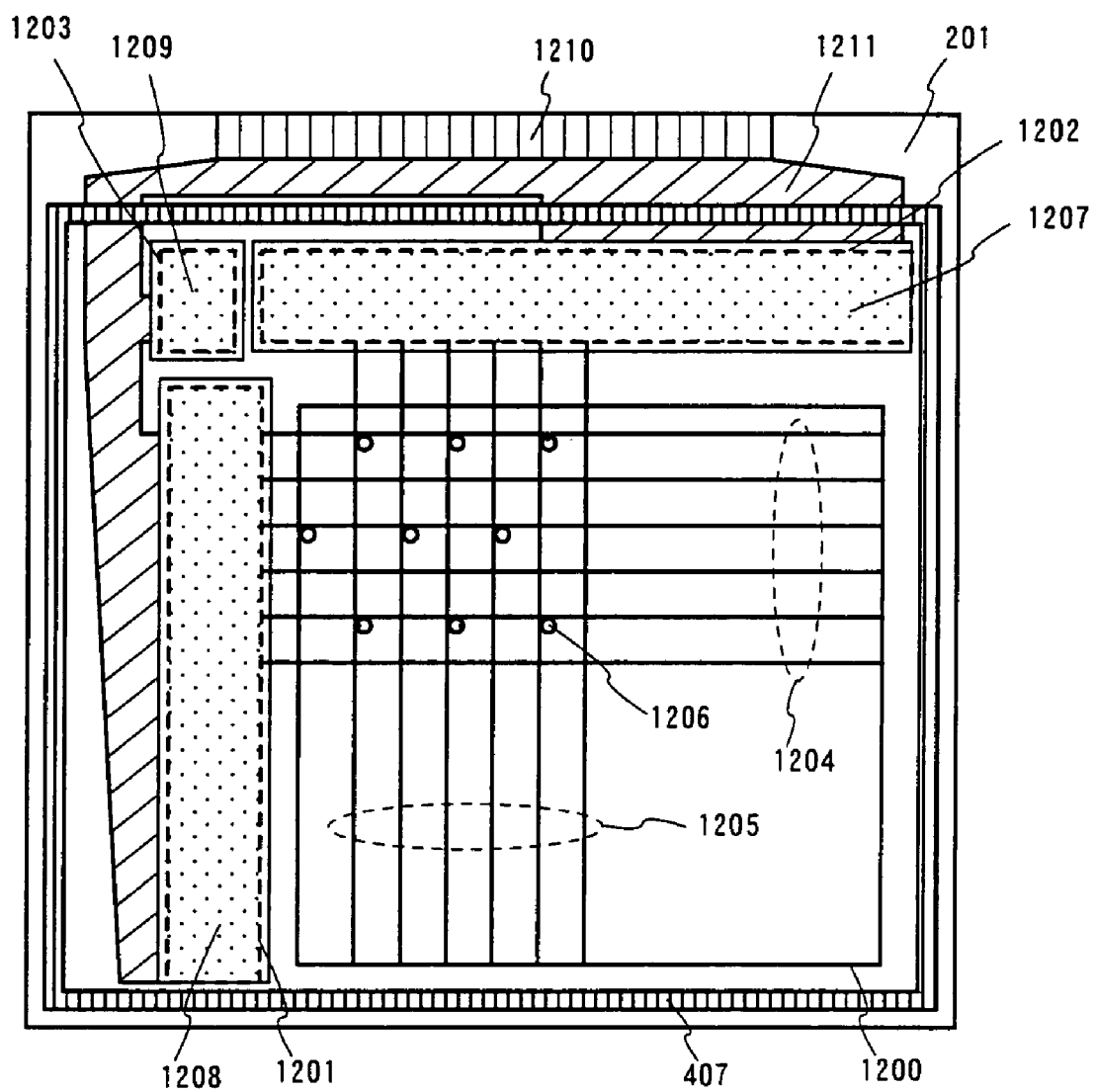
FIG. 12 is a diagram showing the top structure of an active matrix type liquid crystal display device.

FIG. 12 is a top view of an active matrix substrate, showing the positional relation of a pixel portion and a driver circuit portion to a spacer and a sealing material. A scanning signal driver circuit 1201 and an image signal driver circuit 1202 are provided as driver circuits in the periphery of a pixel portion 1200. A signal processing circuit 1203 such as a CPU and a memory may or may not be added thereto.

These driver circuits are connected to external input/output terminal 1210 via a connecting wiring 1211. In the pixel portion 1200, a gate wiring group 1204 extending from the scanning signal driver circuit 1201 and a source wiring group 1205 extending from the image signal driver circuit 1202 intersect like a matrix to form pixels. Each of the pixels is provided with a pixel TFT 304 and a storage capacitance 305.

The spacer 1206 provided in the pixel portion corresponds to the spacer 401f shown in FIG. 11A, and may be provided for every pixel. Alternatively, one spacer may be provided for every several pixels or for every several tens pixels arranged in matrix. That is, the ratio of the spacers to the total of the pixels comprising the pixel portion is appropriately 20 to 100%. Spacers 1207 to 1209 provided in the driver circuit portion may cover the entire surface thereof, or may be separated into plural pieces to coincide with the position of the source wiring and the drain wiring of each TFT as shown in FIGS. 11A and 11B.

The sealing material 407 is formed outside the pixel portion 1200, the scanning signal control circuit 1201, the image signal control circuit 1202, and other signal processing circuit 1203, which are all on a substrate 201, and inside the external input/output terminal 1210.

Figure 13:
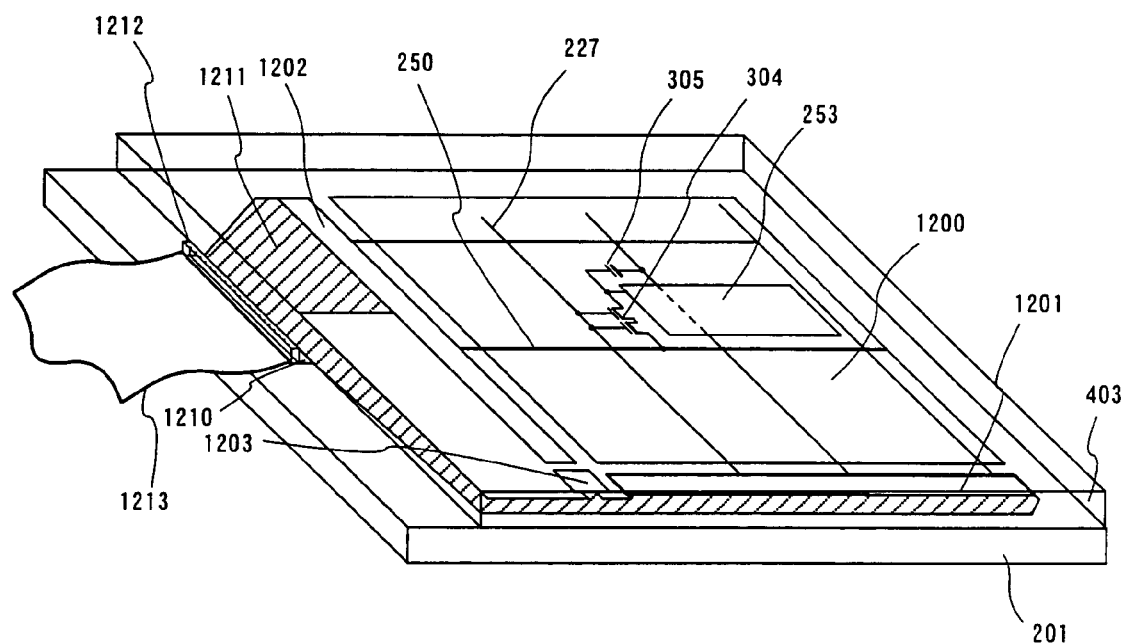
FIG. 13 is a perspective view showing an active matrix type liquid crystal display device.

The structure of such an active matrix type liquid crystal display device is described with reference to a perspective view of FIG. 13. In FIG. 13, the active matrix substrate is comprised of the pixel portion 1200, the scanning signal driver circuit 1201, the image signal driver circuit 1202, and other signal processing circuit 1203 which are formed on the glass substrate 201.

The pixel portion 1200 is provided with the pixel TFT 304 and the capacitor storage 305, and the driver circuits provided in the periphery of the pixel portion are constructed based on a CMOS circuit. The scanning signal driver circuit 1201 and the image signal driver circuit 1202 are connected to the pixel TFT 304 through a gate wiring 227 and a source wiring 250, respectively. A flexible printed circuit (FPC) 1213 is connected to the external input/output terminal 1210 with the intention of using it to input an image signal or the like. The flexible printed circuit (FPC) 1213 is fixed with a reinforced resin 1212 with an enhanced adhesion strength. The FPC is connected to each driver circuit via the connecting wiring 1211. Though not shown in the drawing, an opposite substrate 403 is provided with a light shielding film, a color filter, a transparent electrode, etc.

The liquid crystal display device having the structure as such can be fabricated using an active matrix substrate shown in Embodiment 1. Employing an active matrix substrate shown in FIG. 4C, for instance, a reflection type liquid crystal display device is obtained, while a transmission type liquid crystal display device is obtained when employing an active matrix substrate that uses a transparent conductive film for a pixel electrode as shown in Embodiment 1.

Embodiment 3

An example of performing an island shape semiconductor film laser crystallization process by using a laser apparatus having an optical system which differs from that of Embodiment 1 is explained in Embodiment 3. Specifically, a reflecting body similar to the optical system used in Embodiment 1 is not used in Embodiment 3, and an example of irradiating dual stream laser light, separated midstream by an optical system, on the top surface and the bottom surface of an amorphous semiconductor film is shown. Note that the basic structure of the laser apparatus is very similar to that of the laser apparatus of FIG. 7 explained by Embodiment 1, but it is necessary to have a window through which at least the laser light can pass attached to the stage 702.

Figure 14:
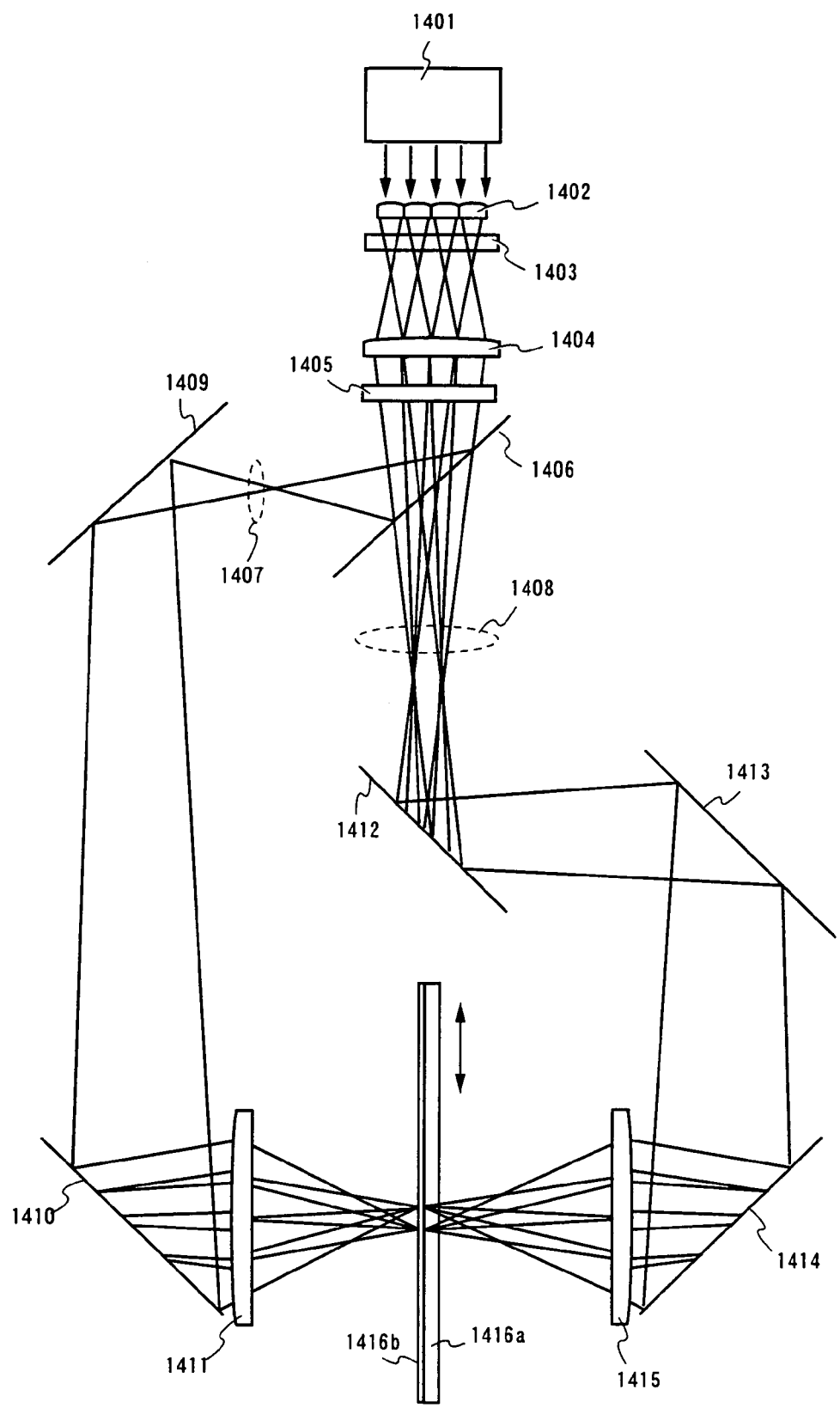
FIG. 14 is a diagram showing the structure of a laser apparatus.

The structure of the optical system used by Embodiment 3 is explained using FIG. 14. FIG. 14 is a diagram of the optical system seen from the side. Laser light from a laser 1401 as an emission source is partitioned in the vertical direction by a cylindrical array lens 1402. The partitioned laser light is additionally partitioned in the horizontal direction by a cylindrical array lens 1403. The laser light is thus partitioned into a matrix state by the cylindrical lens arrays 1402 and 1403.

The laser light is then condensed once by a cylindrical lens 1404. At this point, a cylindrical lens 1405 is passed through directly after the cylindrical lens 1404. Up to this point the system is similar to the optical system shown in FIG. 8.

Next, the laser light is made incident to a half mirror 1406, and the laser light is separated here into primary laser light 1407 and secondary laser light 1408. The primary laser light 1407 is then reflected by mirrors 1409 and 1410, and after passing through a cylindrical lens 1411 it arrives at the top surface of an amorphous semiconductor film 1416b.

Further, the secondary laser light 1408 separated by the half mirror 1406 is reflected by mirrors 1412, 1413, and 1414, and after passing through a cylindrical lens 1415, it is transmitted through a substrate 1416a and arrives at the bottom surface of the amorphous semiconductor film 1416b.

At this point the laser light projected on the irradiation surfaces of the substrate shows a linear shape on the irradiation surfaces, similar to Embodiment 1. Further, the homogenization in the width direction (short direction) of the laser light transformed into a linear shape is performed by the cylindrical lens array 1402, the cylindrical lens 1404, and the cylindrical lens 1415. The homogenization of the above laser light in the length direction (long direction) is performed by the cylindrical lens array 1403, the cylindrical lens 1405, and the cylindrical lens 1409.

It is preferable to satisfy a relationship of $0<(I_0'/I_0)<1$, or a relationship of $1<(I_0'/I_0)$, for the effective energy strength ratio $(I_0'/I_0)$ between the primary laser light, which passes through the cylindrical lens 1411 and is irradiated on the top surface of the amorphous semiconductor film 1416b, and the secondary laser light, which passes through the cylindrical lens 1415 and is irradiated on the bottom surface of the amorphous semiconductor film 1416b.

By using a glass substrate (a material having a transmittivity of approximately 50% with respect to the laser light used here) as the substrate 1416a in this embodiment, the above relational expressions are satisfied. Of course, in addition to the substrate, the effective energy strength of the secondary laser light may also be attenuated by regulating the transmittivity of an insulating film (not shown in the figures) formed on the substrate 1416a, the transmittivity of a stage (not shown in the figures) on which the substrate 1416a is placed, and the reflectivity of the interfaces.

Furthermore, it is also possible to attenuate the effective energy strength of the secondary laser light 1408 by forming a beam attenuator filter such as a variable attenuator in an arbitrary position in the light path of the secondary laser light 1408. On the other hand, it is also possible to attenuate the effective energy strength of the primary laser light 1407 by forming a beam attenuator filter in an arbitrary position in the light path of the primary laser light 1407.

Crystallization of the island shape semiconductor films may be performed by incorporating the optical system of Embodiment 3 into a laser apparatus such as that shown by FIG. 7 of Embodiment 1. An active matrix substrate thus formed can be made into a liquid crystal display device in accordance with Embodiment 2.

Embodiment 4

Figure 15A:
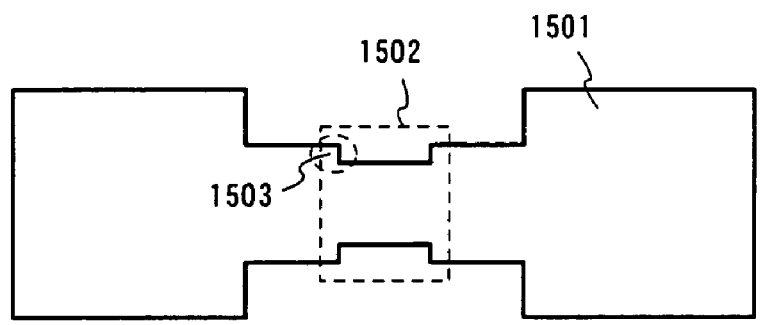
FIGS. 15A to 15B are diagrams showing the shape of an island shape semiconductor film.
Figure 15B:
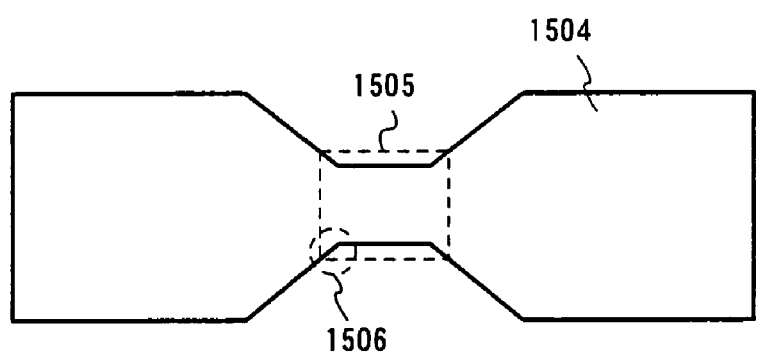

The shape of island shape semiconductor films when performing laser crystallization of amorphous semiconductor films is explained in Embodiment 4 using FIGS. 15A and 15B.

The shape of an island shape semiconductor film 1501 shown in FIG. 15A is for a case of forming a region 1502 containing a "channel forming region after TFT completion" so as to change its shape in steps and to become the thinnest portion. In this case a convex portion denoted by reference numeral 1503 becomes an origin of crystal growth.

Further, the shape of an island shape semiconductor film 1504 shown in FIG. 15B is for a case of forming the region 1502 containing a "channel forming region after TFT completion" so as to change its shape continuously and to become the thinnest portion.

Note that the shapes of the island shape semiconductor films shown in Embodiment 4 are modified examples of the island shape semiconductor films shown in Embodiment 1, and that other structures may be formed in accordance with Embodiment 1. Embodiment 4 can therefore also be implemented when manufacturing the liquid crystal display device of Embodiment 2. Further, laser crystallization using the optical system of Embodiment 3 can also be performed.

Embodiment 5

The shape of the island shape semiconductor films when performing laser crystallization of amorphous semiconductor films is explained in Embodiment 5 using FIGS. 16A to 16E.

Figure 16A:
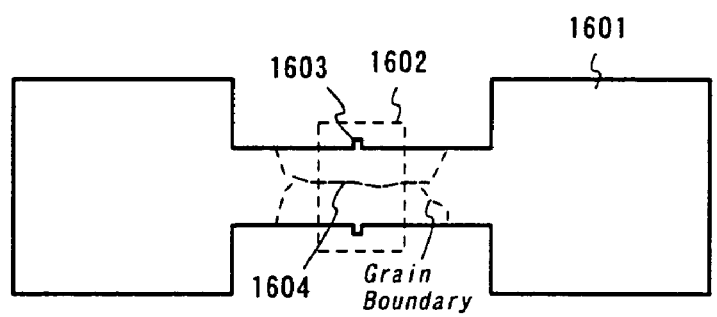
FIGS. 16A to 16E are diagrams showing the shape of an island shape semiconductor film.

The shape of an island shape semiconductor film 1601 shown in FIG. 16A is for a case of forming convex portions 1603 in a region 1602 containing a "channel forming region after TFT completion". The convex portions 1603 may be formed at the same time as the island shape semiconductor film 1601. In this case, the convex portions 1603 become origins of crystal growth.

Note that the convex portions 1603 are formed in two locations sandwiching the island shape semiconductor film 1601, but there are no limitations on the position or the number of convex portions. However, if many convex portions are formed, then the number of grain boundaries within the channel forming region will increase, and therefore it is preferable to form as few convex portions as possible.

For the case of FIG. 16A, grains growing from the two convex portions as origins bump against each other and one grain boundary 1604 is formed in the channel forming region. However, the grain boundary is formed in nearly the same direction as the flow of the carrier, and the motion of the carrier essentially does not become impeded.

Figure 16B:
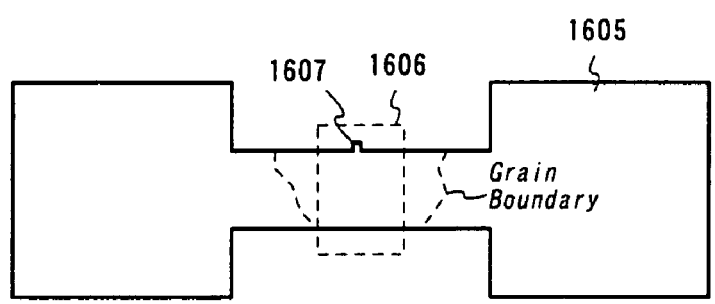

Next, the shape of an island shape semiconductor film 1605 shown in FIG. 16B is for a case of forming a convex portion 1607 in only one location within a region 1606 containing a "channel forming region after TFT completion". The convex portion 1607 may be formed at the same time as the island shape semiconductor film 1605. In this case, provided that the surface area of a grain having the convex portion 1607 as an origin of crystal growth is larger than the surface area of the channel forming region, it is possible to form a channel forming region in which grain boundaries do not exist.

Figure 16C:
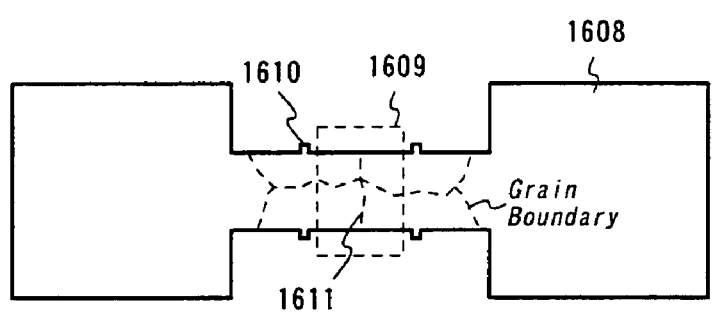

Next, the shape of an island shape semiconductor film 1608 shown in FIG. 16C is for a case of forming convex portions 1610 outside of a region 1609 containing a "channel forming region after TFT completion". The convex portions 1610 may be formed at the same time as the island shape semiconductor film 1608. Note that the convex portions 1610 are formed in four locations so as to enclose the region 1608, but there are no limitations on their location or the number of convex portions formed.

Further, grains growing with the four convex portions as origins bump up against each other for the case of FIG. 16C, forming a cross-shaped grain boundaries 1611 in the channel forming region. However, there is only one grain boundary formed in a direction nearly perpendicular to the direction of the carrier flow (grain boundary formed in the width direction of the channel), and therefore it is difficult for the grain boundaries to become a cause of dispersion of electrical characteristics between adjacent TFTs (in particular, the threshold voltage and the electric field effect mobility).

Note that, throughout this specification, channel width direction indicates the direction in which grain boundaries are formed so as to cross the island shape semiconductor film 1608 within the region 1609 in FIG. 16C. In other words, channel width direction indicates a direction pointing from the top to the bottom (or from the bottom to the top) of the page.

Figure 16D:
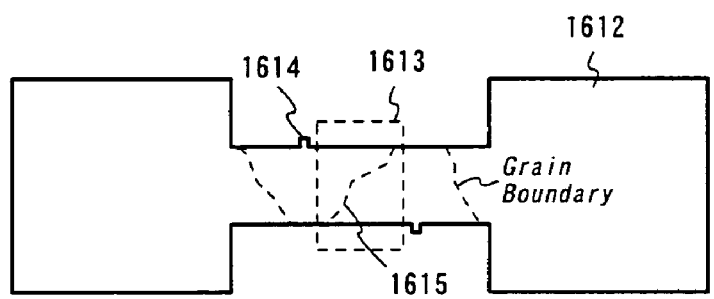

Next, the shape of an island shape semiconductor film 1612 shown in FIG. 16D is for a case of forming two convex portions 1614 in a region 1613 containing a "channel forming region after TFT completion". In this case, grains growing from the two convex portions as origins bump against each other, forming a grain boundary 1615 which crosses the channel forming region diagonally. However, there is only one grain boundary impeding the carrier flow, and therefore it is difficult for the grain boundary to become a cause of dispersion in the electrical characteristics of adjacent TFTs.

Figure 16E:
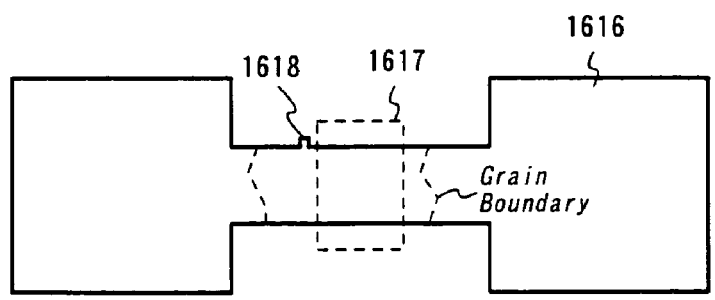

Next, the shape of an island shape semiconductor film 1616 shown in FIG. 16E is for a case of forming a convex portion 1618 in one location outside of a region 1617 containing a "channel forming region after TFT completion". The convex portion 1618 may be formed at the same time as the island shape semiconductor film 1616. In this case, provided that the surface area of a grain having the convex portion 1618 as an origin of crystal growth is larger than the surface area of the channel forming region, it is possible to form a channel forming region in which grain boundaries do not exist.

The shape of the island shape semiconductor films shown in Embodiment 5 are modified examples of the island shape semiconductor films shown in Embodiment 1, and that other structures may be formed in accordance with Embodiment 1. Embodiment 5 can therefore also be implemented when manufacturing the liquid crystal display device of Embodiment 2. Further, laser crystallization using the optical system of Embodiment 3 can also be performed.

Embodiment 6

The shape of island shape semiconductor films when performing laser crystallization of amorphous semiconductor films is explained in Embodiment 6 using FIGS. 17A to 17E.

Figure 17A:
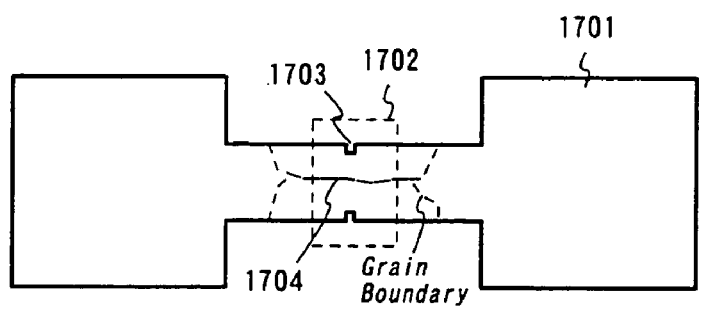
FIGS. 17A to 17E are diagrams showing the shape of an island shape semiconductor film.

The shape of an island shape semiconductor film 1701 shown in FIG. 17A is for a case of forming concave portions 1703 in a region 1702 containing a "channel forming region after TFT completion". The concave portions 1703 may be formed at the same time as the island shape semiconductor film 1701. In this case the concave portions 1703 become origins of crystal growth.

Note that the concave portions 1703 are formed in two locations sandwiching the island shape semiconductor film 1701, but there are no limitations placed on position or number of concave portions. However, if many concave portions are formed, then the number of grain boundaries within the channel forming region will increase, and therefore it is preferable to form as few concave portions as possible.

For the case of FIG. 17A, grains growing from the two concave portions as origins bump against each other and one grain boundary 1704 is formed in the channel forming region. However, the grain boundary is formed in nearly the same direction as the flow of the carrier, and the motion of the carrier essentially does not become impeded.

Figure 17B:
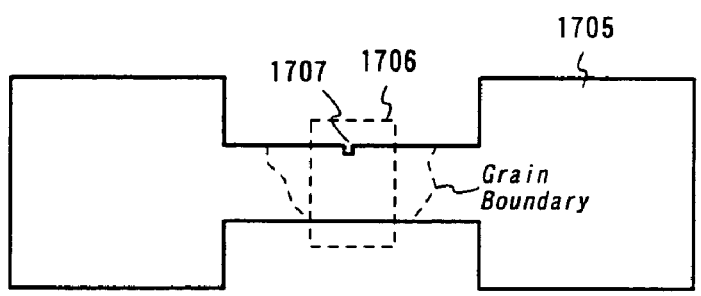

Next, the shape of an island shape semiconductor film 1705 shown in FIG. 17B is for a case of forming a concave portion 1707 in only one location within a region 1706 containing a "channel forming region after TFT completion". The concave portion 1707 may be formed at the same time as the island shape semiconductor film 1705. In this case, provided that the surface area of a grain having the concave portion 1707 as an origin of crystal growth is larger than the surface area of the channel forming region, it is possible to form a channel forming region in which grain boundaries do not exist.

Figure 17C:
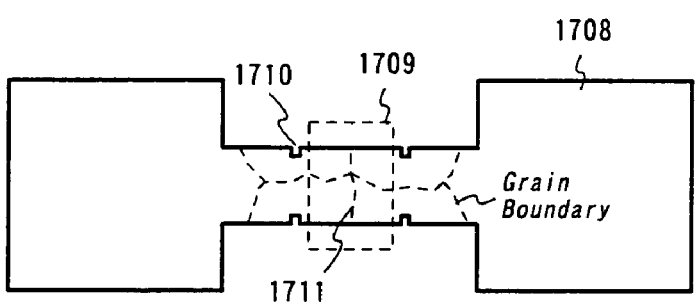

Next, the shape of an island shape semiconductor film 1708 shown in FIG. 17C is for a case of forming concave portions 1710 outside of a region 1709 containing a "channel forming region after TFT completion". The concave portions 1710 may be formed at the same time as the island shape semiconductor film 1708. Note that the concave portions 1710 are formed in four locations so as to enclose the region 1708, but there are no limitations as to their location or to the number of concave portions formed.

Further, grains growing with the four concave portions as origins bump up against each other for the case of FIG. 17C, forming a cross-shaped grain boundaries 1711 in the channel forming region. However, there is only one grain boundary formed in a direction nearly perpendicular to the direction of the carrier flow (grain boundary formed in the width direction of the channel), and therefore it is difficult for the grain boundaries to become a cause of dispersion of electrical characteristics between adjacent TFTs (in particular, the threshold voltage or the electric field effect mobility).

Figure 17D:
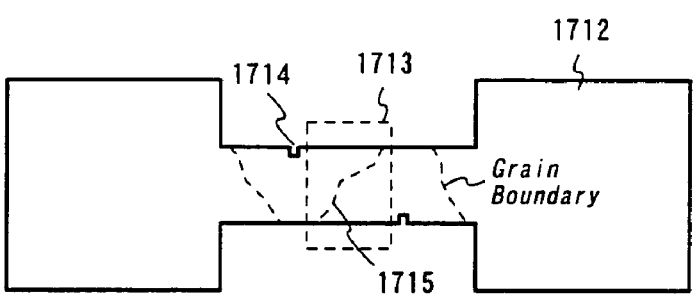

Next, the shape of an island shape semiconductor film 1712 shown in FIG. 17D is for a case of forming two concave portions 1714 outside a region 1713 containing a "channel forming region after TFT completion". In this case, grains growing from the two concave portions as origins bump against each other, forming a grain boundary 1715 which crosses the channel forming region diagonally. However, there is only one grain boundary impeding the carrier flow, and therefore it is difficult for the grain boundary to become a cause of dispersion in the electrical characteristics of adjacent TFTs.

Figure 17E:
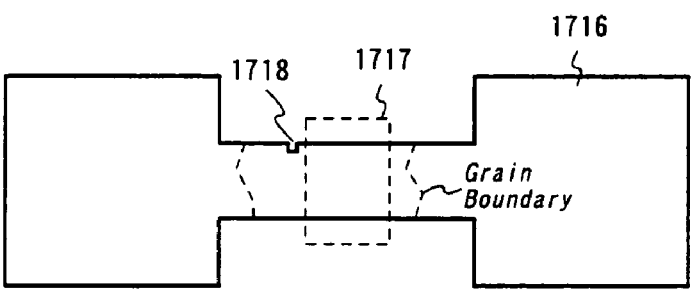

Next, the shape of an island shape semiconductor film 1716 shown in FIG. 17E is for a case of forming a concave portion 1718 in only one location outside of a region 1717 containing a "channel forming region after TFT completion". The concave portion 1718 may be formed at the same time as the island shape semiconductor film 1716. In this case, provided that the surface area of a grain having the concave portion 1718 as an origin of crystal growth is larger than the surface area of the channel forming region, it is possible to form a channel forming region in which grain boundaries do not exist.

The island shape semiconductor films shown in Embodiment 6 are examples of changes in the shape of the island shape semiconductor films shown in Embodiment 1, and other structures may be formed in accordance with Embodiment 1. Embodiment 6 can therefore also be implemented when manufacturing the liquid crystal display device of Embodiment 2. Further, laser crystallization using the optical system of Embodiment 3 can also be performed.

Embodiment 7

Although Embodiments 1 to 6 show examples where the present invention is applied to a liquid crystal display device, the invention is applicable to any semiconductor device as long as it uses a TFT.

Specifically, the present invention can be implemented in laser crystallization step of a semiconductor film which becomes an active layer in manufacturing an active matrix type EL (electroluminescence) display device or an active matrix type EC (electrochromics) display device.

In addition, the present invention can also be implemented when forming a load transistor of an SRAM used in an IC or an LSI, and the present invention is also effective in cases of forming TFTs on an IC or an LSI with a three dimensional structure.

The present invention is an invention pertaining to the laser crystallization step out of a manufacturing process of a TFT, and known procedures of manufacturing TFT may be applied to the rest of the steps of the manufacturing process. Therefore, the present invention is applied to known techniques when manufacturing an active matrix type EL display device or an active matrix type EC display device. Of course, to fabricate these display devices referring to the manufacturing process illustrated in FIGS. 2A to 4C is also possible.

Figure 18A:
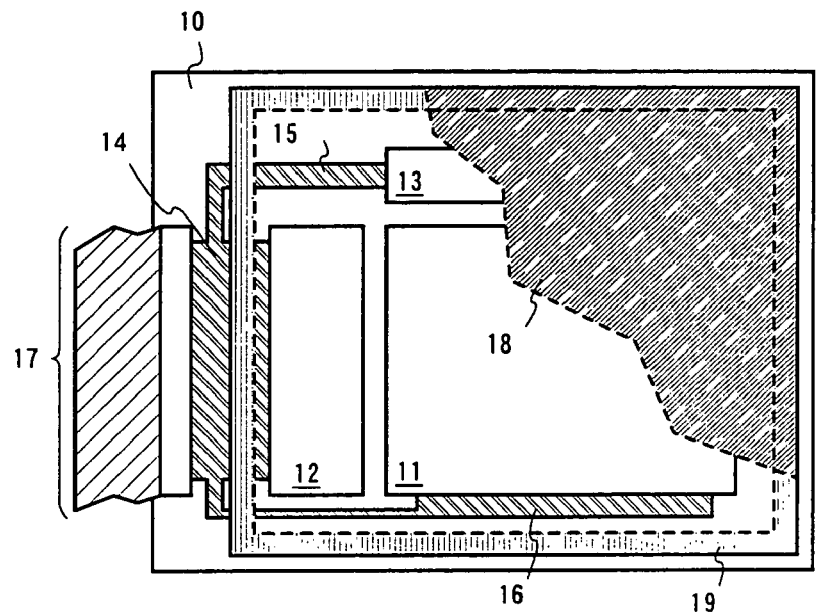
FIGS. 18A to 18B are diagrams showing the structure of an active matrix type EL display device.
Figure 18B:
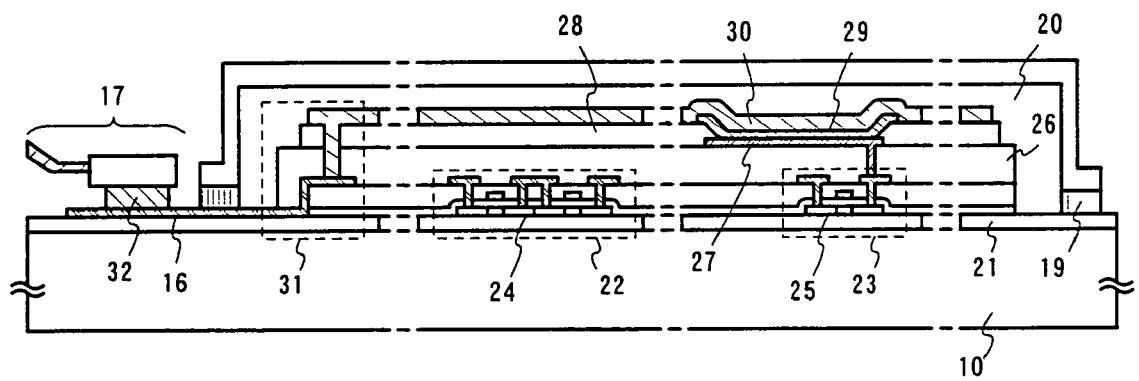

A case of manufacturing an EL display device using the present invention is explained here using FIGS. 18A and 18B. In FIG. 18A, reference numeral 10 denotes a substrate, reference numeral 11 denotes a pixel portion, 12 denotes a source side driver circuit, and 13 denotes a gate side driver circuit. The respective driver circuits extend to an FPC 17 via wirings 14 to 16, and are connected to external equipment.

A sealing material (also referred to as a housing material) 18 is formed at this time so as to surround at least the pixel portion, preferably the driver circuits and the pixel portion. Note that a metallic plate or a glass plate possessing a concave portion so as to surround an element portion may be used for the sealing material 18, and that an ultraviolet hardened resin may also be used. When using a metallic plate having a concave portion which surrounds the element portion as the housing material 18, it is fixed to the substrate 10 by an adhesive 19, and a sealed space is formed between the sealing material 18 and the substrate 10. The EL element is in a state of being completely sealed in the sealed space at this point, and is completely cut-off from the atmosphere.

In addition, it is preferable to fill a gap 20 between the sealing material 18 and the substrate 10 with an inert gas (such as argon, helium, or nitrogen), and to provide a drying agent such as barium oxide. It is thus possible to control deterioration of the EL element due to factors such as moisture.

Further, FIG. 18B is a cross sectional structure of the EL display device of Embodiment 7, and a driver circuit TFT (note that a CMOS circuit combining an n-channel TFT and a p-channel TFT is shown in the figure here) 22 and a pixel portion TFT 23 (note that only a TFT for controlling the current into the EL element is shown in the figure here) 23 are formed on the substrate 10 and a base film 21. The TFTs may use a known structure (a top gate structure or a bottom gate structure).

The present invention can be used when forming semiconductor layers which become an active layer 24 of the driver circuit TFT 22 and an active layer 25 of the pixel portion TFT 23. Further, known techniques may be used for processes other than the formation of the semiconductor layers.

After using the present invention to form the semiconductor layers, and then completing the driver circuit TFT 22 and the pixel portion TFT 23 using the semiconductor layers as active layers, a pixel electrode 27, which electrically connects to a drain of the pixel portion TFT 23, is formed from a transparent conductive film on an interlayer insulating film (leveling film) 26 made from a resin material. An indium oxide tin oxide compound (referred to as ITO) or an indium oxide zinc oxide compound can be used as the transparent conductive film. After forming the pixel electrode 27, an insulating film 28 is formed, and an opening portion is formed on the pixel electrode 27.

An EL layer 29 is formed next. A lamination structure, or a single layer structure, of known EL materials (hole injecting layers, hole transporting layers, luminescing layers, electron transporting layers, or electron injecting layers) may be used as the EL layer 29. Known techniques may be used in order to determine what type of structure to be used. Further, low molecular weight materials and high molecular weight materials (polymers) exist as EL materials. Evaporation is employed when using a low molecular weight material, but it is possible to use an easy method such as spin coating, printing, or ink jet printing when using a high molecular weight material.

The EL layer is formed by evaporation using a shadow mask in Embodiment 7. By forming luminescing layers capable of emitting light at differing wavelengths (red light emitting layer, green light emitting layer, and blue light emitting layer) in each pixel using the shadow mask, color display becomes possible. In addition, a method of combining color changing layers (CCM) with color filters and a method of combining white light emitting layers with color filters exist, and either may also be used. Of course, a single color light emitting EL display device can also be made.

An anode 30 is then formed after forming the EL layer 29. It is preferable to remove as much moisture and oxygen existing in the interface of the anode 30 and the EL layer 29 as possible. It is therefore necessary to use a method such as forming the EL layer 29 and the anode 30 in succession in a vacuum, or forming the EL layer 29 in an inert atmosphere, and then forming the anode 30 without exposure to the atmosphere. By using a multi-chamber method (cluster tool method) film deposition device in Embodiment 7, it is possible to perform film deposition as stated above.

Note that a lamination structure of an LiF (lithium fluoride) film and an Al (aluminum) film is used as the anode 30 in Embodiment 7. Specifically, a 1 nm thick LiF (lithium fluoride) film is formed by evaporation on the EL layer 29, and a 300 nm thick aluminum film is formed on the LiF film. Of course, an MgAg electrode, a known anode material, may also be used. The anode 30 is then connected to the wiring 16 in a region denoted by reference numeral 31. The wiring 16 is a power supply line for imparting a predetermined voltage to the anode 30, and is connected to the FPC 17 through a conductive paste material 32.

In order to electrically connect the anode 30 and the wiring 16 in the region denoted by reference numeral 31, it is necessary to form contact holes in the interlayer insulating film 26 and the insulating film 28. The contact holes may be formed when the interlayer insulating film 26 is etched (when forming the pixel electrode contact hole) and when the insulating film 28 is etched (when forming the opening portion before EL layer formation). Further, when etching the insulating film 28, etching may be performed all the way to the interlayer insulating film 26 at one time. The contact hole can be formed with a good shape in this case provided that the interlayer insulating film 26 and the insulating film 28 are the same resin material.

Furthermore, the wiring 16 is electrically connected to the FPC 17 through a gap between the sealing material 18 and the substrate 10 (filled by the adhesive 19). Note that the wiring 16 is explained here, but the other wirings 14 and 15 are also similarly connected electrically to the FPC 17 under the sealing material 18.

The present invention can be used in an EL display device having the above structure. The crystallinity of the semiconductor layers which become the active layers of the TFTs is improved by using the present invention, and therefore the electrical characteristics of the TFTs (in particular, subthreshold coefficient and electrical field effect mobility) are improved. It therefore becomes possible to display an image having good image quality.

Embodiment 8

It is possible to implement the present invention for an electronic device (also referred to as electronic equipment) having an electro-optical device, such as an active matrix type liquid crystal display device or an active matrix type EL display device, as a display. The following can be given as examples of electronic devices: a personal computer, a projector, a digital camera, a video camera, a head mounted display (goggle type display), a portable information terminal (such as a mobile computer, a portable telephone, or an electronic book), a navigation system, a game machine, an image playback machine (such as a DVD player), a music playback machine (such as a CD player or an MD player), etc.

Figure 19A:
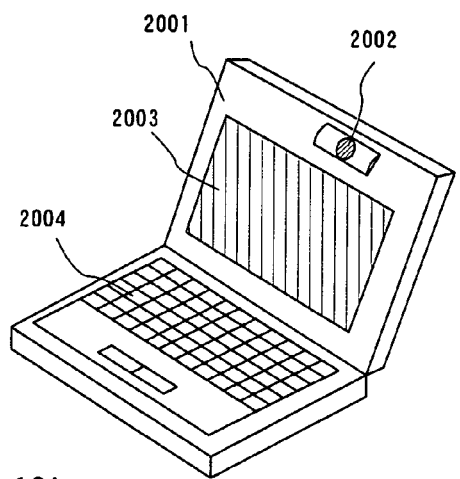
FIGS. 19A to 19F are diagrams showing examples of electronic devices.

FIG. 19A shows a personal computer that is comprised of a main body 2001 provided with a micro processor, a memory, etc., an image input unit 2002, a display unit 2003, and a keyboard 2004. The present invention can be implemented in fabricating the display unit 2003 and other signal processing circuits.

Figure 19B:
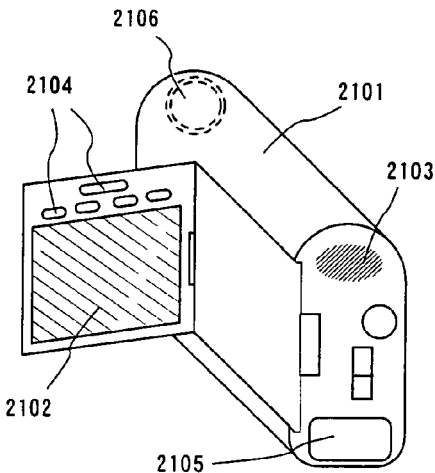

FIG. 19B shows a video camera that is comprised of a main body 2101, a display unit 2102, an audio input unit 2103, operation switches 2104, a battery 2105, and an image receiving unit 2106. The present invention can be implemented in fabricating the display unit 2102.

Figure 19C:
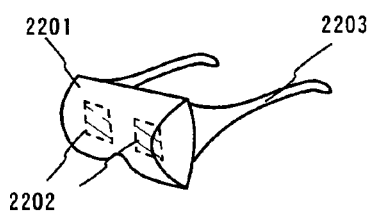

FIG. 19C shows a goggle type display that is comprised of a main body 2201, display units 2202, and arm portions 2203. The present invention can be implemented in fabricating the display units 2202.

Figure 19D:
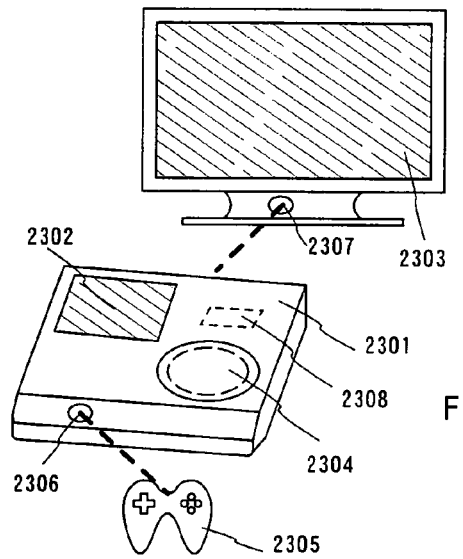

FIG. 19D shows an electronic game machine such as a television game or a video game that is comprised of a main body 2301 loaded with an electric circuit 2308 such as a CPU and with a recording medium 2304, a controller 2305, a display unit 2303, and a display unit 2302 incorporated in the main body 2301. The display unit 2303 and the display unit 2302 incorporated in the main body 2301 may display the same information. Alternatively, the former may serve as a main display unit while the latter serve as a sub-display unit to display information of the recording medium 2304 or the operation state of the machine. The latter may instead serve as an operating panel by adding thereto the touch sensor function. The main body 2301, the controller 2305 and the display unit 2303 transmit signals to one another through wired communication, or through wireless communication or optical communication by providing sensor units 2306, 2307. The present invention can be implemented in fabricating the display units 2302, 2303. A conventional CRT display may be used as the display unit 2303.

Figure 19E:
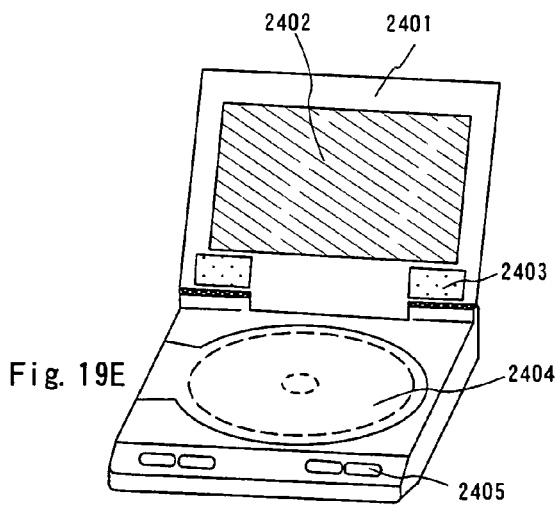

FIG. 19E shows a player which uses a recording medium in which a program is stored (hereinafter referred to as a recording medium) and which is comprised of a main body 2401, a display unit 2402, speaker units 2403, a recording medium 2404, and operation switches 2405. A DVD (Digital Versatile Disc), a compact disc (CD) or the like is used as the recording medium to enable the player to reproduce a music program, display an image, play a video game (or a television game), or display information obtained through the Internet. The present invention can be implemented in fabricating the display unit 2402.

Figure 19F:
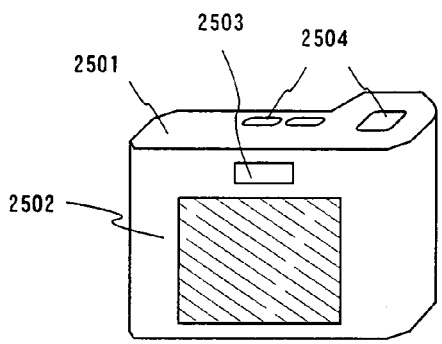

FIG. 19F shows a digital camera that is comprised of a main body 2501, a display unit 2502, an eye-piece portion 2503, operation switches 2504, and an image receiving unit (not shown). The present invention can be implemented in fabricating the display unit 2502.

Next, an example of a projector using a liquid crystal display device manufactured by implementing the present invention is shown in FIGS. 20A to 20D.

Figure 20A:
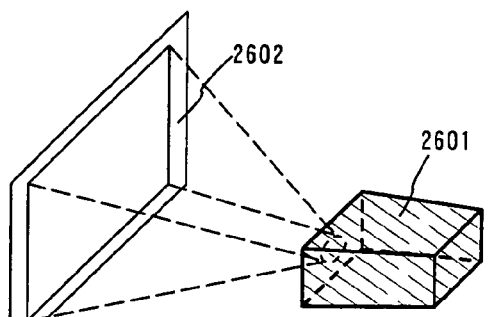
FIGS. 20A to 20D are diagrams showing examples of a projector.

FIG. 20A is a front type projector, and is composed of an electro-optical engine (a system containing light source optical system and a display device) 2601, and a screen 2602. Further, FIG. 20B is a rear type projector, and is composed of a main body 2701, an optical engine 2702, a mirror 2703, and a screen 2704.

Figure 20B:
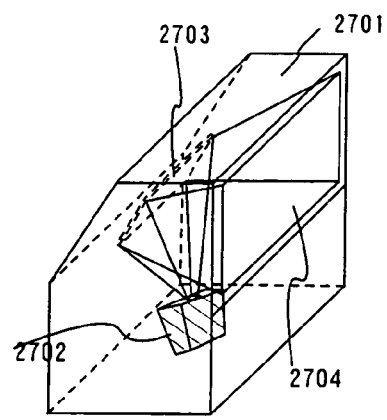
Figure 20C:
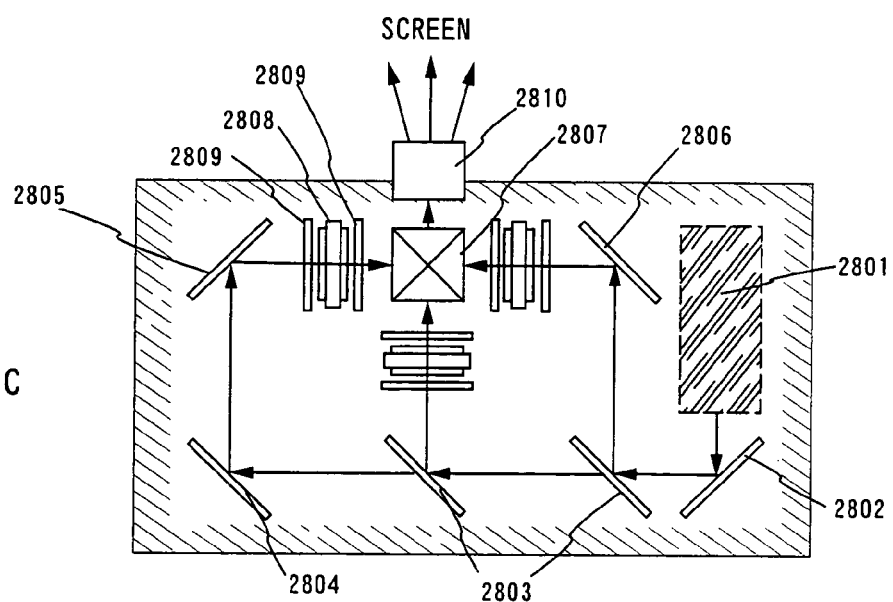

Note that one example of the structure of the optical engines 2601 and 2702 of FIG. 20A and FIG. 20B is shown in FIG. 20C. The optical engines 2601 and 2702 are composed of a light source optical system 2801, mirrors 2802 and 2804 to 2806, a—dichroic mirror 2803, a beam splitter 2807, a liquid crystal display device 2808, a phase difference plate 2809, and a projecting optical system 2810. The projecting optical system 2810 is composed of a plurality of optical lenses. The present invention can be used in the liquid crystal display device 2808.

An example of a three plate type display using three of the liquid crystal display devices 2808 is shown in FIG. 20C, but there are no limitations placed on the structure, and it may also be structured by a single plate type optical system. Further, components such as a optical lens, a film having a light polarizing function, a film for regulating the phase, and an IR film may be suitably placed in the optical path shown by the arrow in FIG. 20C.

Figure 20D:
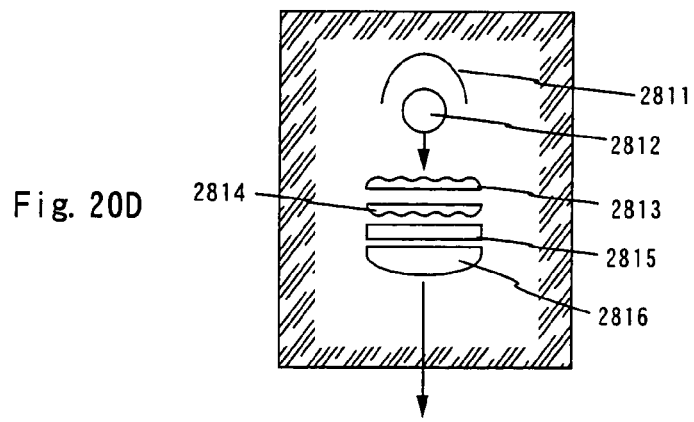

Furthermore, FIG. 20D is a diagram showing one example of the structure of the light source optical system 2801 in FIG. 20C. In Embodiment 8, the light source optical system 2801 is composed of a reflector 2811, a light source 2812, lens arrays 2813 and 2814, a polarizing transformation element 2815, and a condenser lens 2816. Note that the light source optical system shown in FIG. 20D is one example, and the light source optical system is not limited to the structure shown in the figure.

In addition, although not shown in the figures here, the present invention can be implemented when manufacturing components such as a read-in circuit of a navigation system or an image sensor. The applicable scope of the present invention is thus extremely wide, and the present invention can be implemented when manufacturing electronic devices of all fields.

Embodiment 9

The effect of the present invention is explained based on experimental results. First, a 1.1 mm thick quartz substrate is prepared as a substrate, a 200 nm thick silicon nitride oxide film (SiON film) is formed, and an amorphous silicon film is deposited on the SiON film. In addition, the amorphous silicon film is patterned into an island shape semiconductor film. The island shape semiconductor film is formed having portions in which the shape changes continuously, as shown in FIG. 15B.

Next, laser crystallization of the island shape semiconductor film is performed in accordance with the structure explained by using FIG. 9 in Embodiment 1. A tungsten nitride film formed on a silicon substrate is used as a reflecting body at this time. Further, a 150 μm gap exists between the reflecting body and the quartz substrate.

Excimer laser light is irradiated in this state on the island shape semiconductor film at room temperature in an air atmosphere. The excimer laser light is transformed into a linear shape (0.4 mm×160 mm) cross section by an optical system, and is scanned from one edge of the substrate to the opposite edge. Further, the scanning speed is set to 1 mm/s, the energy density is 336 mJ/cm$^2$, the pulse width is 30 ns, and the repetition frequency is set to 30 Hz, with an overlap ratio of 90%. Twenty shots of laser light can thus be irradiated to one location.

Figure 21:
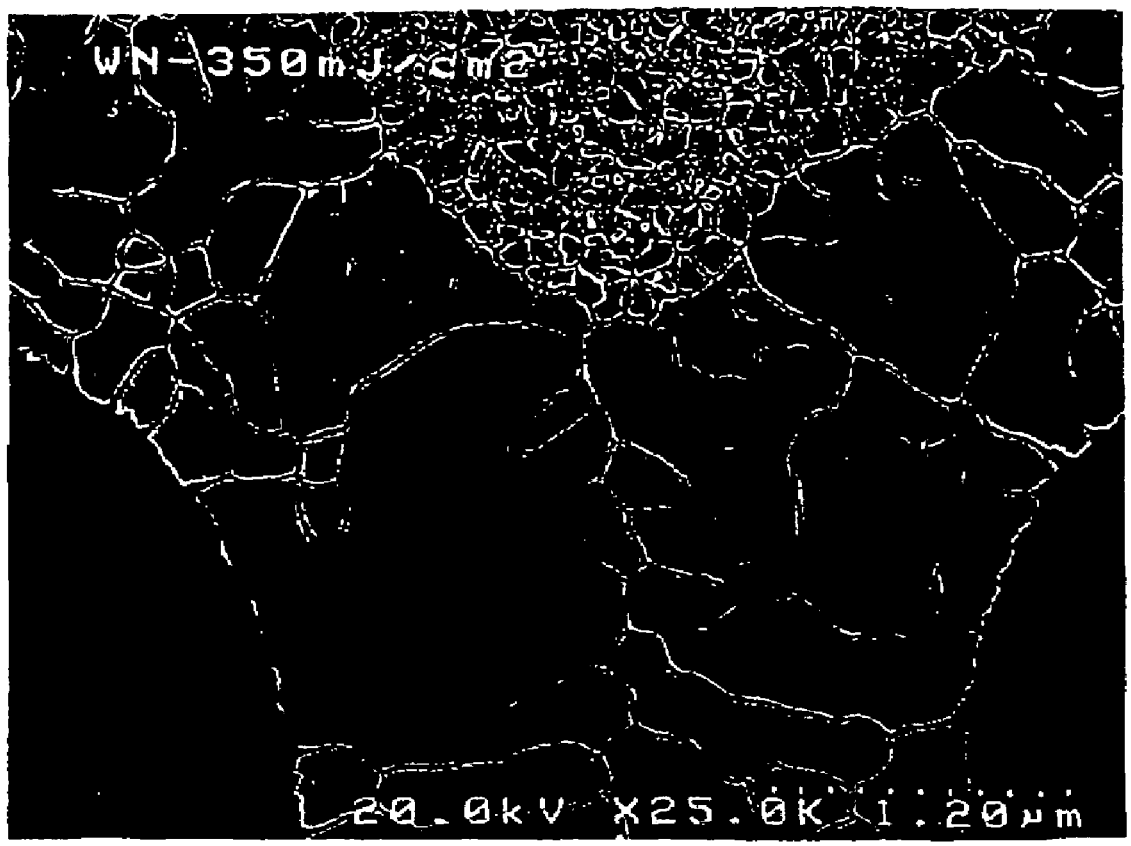
FIG. 21 is a SEM photograph of crystal grains of an island shape semiconductor film.

A SEM photograph of a polysilicon film crystallized in accordance with Embodiment 9 is shown in FIG. 21. Note that FIG. 21 is a state after Secco etching. Secco etching uses a room temperature etchant of 50 cc hydrofluoric acid solution, 25 cc water, with 1.14 g of potassium chromate added.

As a result, as shown by photograph observed by SEM (scanning electron microscopy) of FIG. 21, large grain crystals can be confirmed in the portion of the island shape semiconductor film in which the shape changes continuously. It can be considered that this verifies the effect of the present invention.

When crystallizing an amorphous semiconductor film by using laser light in accordance with the present invention, it becomes possible to control the position of a crystal nucleus which becomes an origin of crystal growth, and grains having a sufficiently large grain size can be formed in desired positions.

As a result, it becomes possible to have one grain boundary, preferably zero grain boundaries, contained within at least a channel forming region of an active layer (island shape semiconductor film) of a TFT, and it is possible to improve any reductions of, and dispersion in, the electrical characteristics of the TFT caused by grain boundaries.

In addition, the performance of a semiconductor device formed by the TFT, and the performance of an electronic device using the semiconductor device, can be greatly increased.

What is claimed is:

1. A semiconductor device comprising:
    a TFT formed over a substrate;
    an active layer formed in the TFT; and
    a first region, a second region and a third region formed in the active layer, the third region being formed between the first region and the second region,
    wherein the third region includes a channel forming region,
    wherein the third region has a first width and a second width,
    wherein the first width and the second width of the third region are narrower than a width of the first region and a width of the second region,
    wherein each of the first width and the second width of the third region is a length in a direction perpendicular to a carrier flow direction, and the direction of the first width and the direction of the second width are the same,
    wherein each of the width of the first region and the width of the second region is a length in the direction perpendicular to the carrier flow direction,
    wherein a portion of the third region is convexed or concaved in the direction perpendicular to the carrier flow direction, which is parallel to a plane of the substrate, the convexed portion being a part of the second width,
    wherein the number of grain boundaries crossing the channel forming region in a width direction of the channel forming region is zero,
    wherein the first width is narrower than the second width, and
    wherein the convexed or concaved portion becomes an origin of crystal growth.

2. A semiconductor device comprising:
    a TFT formed over a substrate;
    an active layer formed in the TFT; and a first region, a second region and a third region formed in the active layer, the third region being formed between the first region and the second region, wherein the third region includes a channel forming region, wherein the third region has a first width and a second width, wherein the first width and the second width of the third region are narrower than a width of the first region and a width of the second region, wherein each of the first width and the second width of the third region is a length in a direction perpendicular to a carrier flow direction, and the direction of the first width and the direction of the second width are the same, wherein each of the width of the first region and the width of the second region is a length in the direction perpendicular to the carrier flow direction, wherein a portion of the third region is convexed or concaved in the direction perpendicular to the carder flow direction, which is parallel to a plane of the substrate, the convexed portion being a part of the second width, wherein the number of grain boundary contained in the channel forming region is zero, wherein the first width is narrower than the second width, and wherein the convexed or concaved portion becomes an origin of crystal growth.

3. A semiconductor device according to claim 1 or 2, wherein said semiconductor device is incorporated into an electronic device selected from the group consisting of a personal computer, a projector, a digital camera, a video camera, a head mounted display, a portable information terminal, a navigation system, a game machine, an image playback machine and a music playback machine.

4. A semiconductor device comprising:

a semiconductor layer formed over a substrate; and a first region, a second region and a third region formed in the semiconductor layer, the third region being formed between the first region and the second region, wherein the third region includes a channel forming region, wherein the third region has a first width and a second width, wherein the first width and the second width of the third region are narrower than a width of the first region and a width of the second region, wherein each of the first width and the second width of the third region is a length in a direction perpendicular to a carrier flow direction, and the direction of the first width and the direction of the second width are the same, wherein each of the width of the first region and the width of the second region is a length in the direction perpendicular to the channel length direction, wherein a portion of the third region is convexed in the direction perpendicular to the channel length direction and parallel to a plane of the substrate, the convexed portion being a part of the second width, wherein the number of grain boundaries crossing the channel forming region in a width direction of the channel forming region is zero, wherein the first width is narrower than the second width, and wherein the convexed portion becomes an origin of crystal growth.

5. A semiconductor device comprising:

a semiconductor layer formed over a substrate; and a first region, a second region and a third region formed in the semiconductor layer, the third region being formed between the first region and the second region, wherein the third region includes a channel forming region, wherein the third region has a first width and a second width, wherein the first width and the second width of the third region are narrower than a width of the first region and a width of the second region, wherein each of the first width and the second width of the third region is a length in a direction perpendicular to a carrier flow direction, and the direction of the first width and the direction of the second width are the same, wherein each of the width of the first region and the width of the second region is a length in the direction perpendicular to the channel length direction, wherein a portion of the third region is concaved in the direction perpendicular to the channel length direction and parallel to a plane of the substrate, the channel forming region including the concaved portion and having the first width, wherein the number of grain boundaries crossing the channel forming region in a width direction of the channel forming region is zero, wherein the first width is narrower than the second width, and wherein the concaved portion becomes an origin of crystal growth.

6. A semiconductor device comprising:

a semiconductor layer formed over a substrate; and a first region, a second region and a third region formed in the semiconductor layer, the third region being formed between the first region and the second region, wherein the third region includes a channel forming region, wherein the third region has a first width and a second width, wherein the first width and the second width of the third region are narrower than a width of the first region and a width of the second region, wherein each of the first width and the second width of the third region is a length in a direction perpendicular to a carrier flow direction, and the direction of the first width and the direction of the second width are the same, wherein each of the width of the first region and the width of the second region is a length in the direction perpendicular to the carrier flow direction, wherein a portion of the third region is convexed in the direction perpendicular to the carrier flow direction and parallel to a plane of the substrate, the convexed portion being a part of the second width, wherein the number of grain boundaries crossing the channel forming region in a width direction of the channel forming region is zero, wherein the first width is narrower than the second width, and wherein the convexed portion becomes an origin of crystal growth.

7. A semiconductor device comprising:

a semiconductor layer formed over a substrate; and a first region, a second region and a third region formed in the semiconductor layer, the third region being formed between the first region and the second region, wherein the third region includes a channel forming region, wherein the third region has a first width and a second width, wherein the first width and the second width of the third region are narrower than a width of the first region and a width of the second region, wherein each of the first width and the second width of the third region is a length in a direction perpendicular to a carrier flow direction, and the direction of the first width and the direction of the second width are the same, wherein each of the width of the first region and the width of the second region is a length in the direction perpendicular to the carrier flow direction, wherein a portion of the third region is concaved in the direction perpendicular to the carrier flow direction and parallel to a plane of the substrate, the channel forming region including the concaved portion and having the first width, wherein the number of grain boundaries crossing the channel forming region in a width direction of the channel forming region is zero, wherein the first width is narrower than the second width, and wherein the concaved portion becomes an origin of crystal growth.

8. A semiconductor device according to any one of claims 4, 5, 6 and 7, wherein said semiconductor device is incorporated into an electronic device selected from the group consisting of a personal computer, a projector, a digital camera, a video camera, a head mounted display, a portable information terminal, a navigation system, a game machine, an image playback machine and a music playback machine.

9. A semiconductor device according to claim 4, wherein the channel length direction is parallel to a direction in which a carrier flows from the first region to the second region.

10. A semiconductor device according to claim 5, wherein the channel length direction is parallel to a direction in which a carrier flows from the first region to the second region.

11. A semiconductor device according to claim 4, wherein zero or one grain boundary is contained in the channel forming region.

12. A semiconductor device according to claim 5, wherein zero or one grain boundary is contained in the channel forming region.

13. A semiconductor device according to claim 6, wherein zero or one grain boundary is contained in the channel forming region.

14. A semiconductor device according to claim 7, wherein zero or one grain boundary is contained in the channel forming region.

15. A semiconductor device according to claim 4, wherein the number of grain boundaries crossing the channel forming region in a width direction of the channel forming region is zero or one.

16. A semiconductor device according to claim 5, wherein the number of grain boundaries crossing the channel forming region in a width direction of the channel forming region is zero or one.

17. A semiconductor device according to claim 6, wherein the number of grain boundaries crossing the channel forming region in a width direction of the channel forming region is zero or one.

18. A semiconductor device according to claim 7, wherein the number of grain boundaries crossing the channel forming region in a width direction of the channel forming region is zero or one.

19. A semiconductor device according to claim 1, wherein the first region includes a source region and the second region includes a drain region.

20. A semiconductor device according to claim 2, wherein the first region includes a source region and the second region includes a drain region.

21. A semiconductor device according to claim 4, wherein the first region includes a source region and the second region includes a drain region.

22. A semiconductor device according to claim 5, wherein the first region includes a source region and the second region includes a drain region.

23. A semiconductor device according to claim 6, wherein the first region includes a source region and the second region includes a drain region.

24. A semiconductor device according to claim 7, wherein the first region includes a source region and the second region includes a drain region.

25. A semiconductor device according to claim 1, wherein the convexed or concaved portion is formed in the channel forming region or a range within 1 µm from an edge of the channel forming region.

26. A semiconductor device according to claim 2, wherein the convexed or concaved portion is formed in the channel forming region or a range within 1 µm from an edge of the channel forming region.

27. A semiconductor device according to claim 4, wherein the convexed portion is formed in the channel forming region or a range within 1 µm from an edge of the channel forming region.

28. A semiconductor device according to claim 5, wherein the concaved portion is formed in the channel forming region or a range within 1 µm from an edge of the channel forming region.

29. A semiconductor device according to claim 6, wherein the convexed portion is formed in the channel forming region or a range within 1 µm from an edge of the channel forming region.

30. A semiconductor device according to claim 7, wherein the concaved portion is formed in the channel forming region or a range within 1 µm from an edge of the channel forming region.

* * * * *